US009661778B1

(12) United States Patent
Ross et al.

(10) Patent No.: US 9,661,778 B1
(45) Date of Patent: May 23, 2017

(54) DEPLOYABLE BARRIER FOR DATA CENTER

(71) Applicant: Amazon Technologies, Inc., Reno, NV (US)

(72) Inventors: Peter George Ross, Olympia, WA (US); Timothy Logan Sadler, Edmonds, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/318,132

(22) Filed: Jun. 27, 2014

(51) Int. Cl.
*H05K 7/14* (2006.01)
*E04H 5/00* (2006.01)

(52) U.S. Cl.
CPC .............. *H05K 7/1497* (2013.01); *E04H 5/00* (2013.01)

(58) Field of Classification Search
CPC .......... H05K 7/1497; H05K 7/20; H05K 7/18; E04H 2005/005; E04H 5/02; E04H 1/00; E04H 5/00; H02G 3/288
See application file for complete search history.

(56) References Cited

U.S. PATENT DOCUMENTS

| | | | | | |
|---|---|---|---|---|---|
| 2,886,856 | A | * | 5/1959 | Kun | E04B 1/3444 296/171 |
| 3,060,521 | A | * | 10/1962 | Greco | E04B 2/827 160/201 |
| 3,107,400 | A | * | 10/1963 | Anderson | E04B 2/827 52/243.1 |
| 3,643,389 | A | * | 2/1972 | Sheppley, Jr. | 52/79.1 |
| 3,863,404 | A | * | 2/1975 | Wahlquist | E04B 1/3445 52/143 |
| 3,924,370 | A | * | 12/1975 | Cauceglia et al. | 52/126.6 |
| 3,984,949 | A | * | 10/1976 | Wahlquist | E04B 2/74 52/143 |
| 4,074,475 | A | * | 2/1978 | Wahlquist | E04B 1/3445 52/143 |
| 4,161,850 | A | * | 7/1979 | Peterson | E04B 2/82 16/379 |

(Continued)

OTHER PUBLICATIONS

"In Plant Office and Clean Room Applications", Unistrut Service Company, accessed Jun. 26, 2014, pp. 1-2.

(Continued)

*Primary Examiner* — James Ference
(74) *Attorney, Agent, or Firm* — Robert C. Kowert; Meyertons, Hood, Kivlin, Kowert & Goetzel, P.C.

(57) ABSTRACT

Deployable barriers are reversibly deployed in a data center hall to partition the data center. The hall is partitioned into an operational area, where rack computer systems are installed, a non-operational area, and a staging area where support infrastructure is at least partially installed. A barrier can be collapsed to incorporate the staging area into the operational area, thereby expanding the operational area, when rack computer systems are to be installed in the staging area. A barrier deployed in the non-operational area establishes another staging area. A barrier includes a deployment mechanism which extends through a space in the data center to enable a partition to be extended to partition the hall. The barrier can be mounted and deployed on support infrastructure, so that the deployed barrier and a side portion of the support infrastructure collectively partition the hall.

3 Claims, 14 Drawing Sheets

(56) References Cited

U.S. PATENT DOCUMENTS

| | | | | |
|---|---|---|---|---|
| 4,295,307 | A | * | 10/1981 | Jensen ............... E04B 2/7425 52/127.1 |
| 4,478,467 | A | * | 10/1984 | Tyndall ............... A47B 43/00 211/87.01 |
| 4,676,036 | A | * | 6/1987 | Bessert ....................... 52/126.6 |
| 4,829,726 | A | * | 5/1989 | de Potter d'Indoye ............. E04B 1/3444 52/64 |
| 4,932,172 | A | * | 6/1990 | Maas ................. E04B 2/7427 312/297 |
| 5,025,603 | A | * | 6/1991 | Johnson ............. E04B 2/7425 174/505 |
| 5,053,637 | A | * | 10/1991 | Dillard ......................... 307/147 |
| 5,167,575 | A | * | 12/1992 | MacDonald ............ E04B 2/827 454/187 |
| 5,214,885 | A | * | 6/1993 | Maas ................. E04B 2/7427 52/239 |
| 5,467,609 | A | * | 11/1995 | Feeney ......................... 62/259.2 |
| 5,477,649 | A | * | 12/1995 | Bessert ........................... 52/263 |
| 5,628,157 | A | * | 5/1997 | Chen ............................. 52/263 |
| 5,784,843 | A | * | 7/1998 | Greer et al. ................... 52/220.7 |
| 5,829,202 | A | * | 11/1998 | Canton Gongora . A47B 83/001 52/239 |
| 5,996,287 | A | * | 12/1999 | Sullivan .................... E04B 2/82 160/135 |
| 6,016,636 | A | * | 1/2000 | Caputo ................. B63B 29/025 114/189 |
| 6,158,178 | A | * | 12/2000 | Jeffers ................. E04B 2/7437 52/220.7 |
| 6,216,398 | B1 | * | 4/2001 | Shipman ............... E04B 2/7453 108/50.01 |
| 6,243,992 | B1 | * | 6/2001 | Gyllenhammar ......... B60P 3/34 296/26.05 |
| 6,434,895 | B1 | * | 8/2002 | Hosterman ............... B60P 3/34 52/143 |
| 6,481,169 | B1 | * | 11/2002 | Ludwig ................. E04B 2/7453 160/351 |
| 6,550,195 | B1 | * | 4/2003 | Cooper et al. ............... 52/220.3 |
| 6,681,702 | B1 | * | 1/2004 | Nicely ........................ 105/157.1 |
| 6,881,898 | B2 | * | 4/2005 | Baker et al. .................... 174/50 |
| 7,165,497 | B2 | * | 1/2007 | Gilbert et al. ................ 104/287 |
| 7,183,504 | B2 | * | 2/2007 | Byrne ........................... 174/486 |
| 7,475,514 | B2 | * | 1/2009 | Rulquin ............... E04B 1/3445 119/519 |
| 7,614,896 | B2 | * | 11/2009 | Johnson et al. .............. 439/215 |
| 7,826,202 | B2 | * | 11/2010 | Johnson et al. .............. 361/641 |
| 7,854,652 | B2 | * | 12/2010 | Yates et al. ................... 454/184 |
| 7,971,446 | B2 | * | 7/2011 | Clidaras et al. ............. 62/259.2 |
| 8,173,898 | B2 | * | 5/2012 | Rasmussen et al. ............ 174/50 |
| 2004/0244310 | A1 | * | 12/2004 | Blumberg ...................... 52/79.1 |
| 2005/0257439 | A1 | * | 11/2005 | Sarver et al. .................. 52/79.1 |
| 2007/0130845 | A1 | * | 6/2007 | Halverson ..................... 52/79.1 |
| 2007/0144079 | A1 | * | 6/2007 | Hourihan ...................... 52/79.1 |
| 2008/0256878 | A1 | * | 10/2008 | Berns et al. ................... 52/79.6 |
| 2009/0151300 | A1 | * | 6/2009 | Hsueh ................... E04B 2/7457 52/762 |
| 2009/0229194 | A1 | * | 9/2009 | Armillas ........................ 52/79.1 |
| 2010/0170277 | A1 | * | 7/2010 | Schmitt et al. .............. 62/259.2 |
| 2010/0223858 | A1 | * | 9/2010 | Billings ......................... 52/79.1 |
| 2011/0023388 | A1 | * | 2/2011 | Tong et al. .................. 52/173.1 |
| 2011/0083824 | A1 | * | 4/2011 | Rogers ......................... 165/80.2 |
| 2011/0122561 | A1 | * | 5/2011 | Pierson et al. ........... 361/679.02 |
| 2011/0240497 | A1 | * | 10/2011 | Dechene et al. .............. 206/320 |
| 2011/0307102 | A1 | * | 12/2011 | Czamara et al. .............. 700/277 |
| 2012/0155027 | A1 | * | 6/2012 | Broome et al. ............... 361/696 |
| 2012/0255710 | A1 | * | 10/2012 | Maselli et al. ............... 165/80.2 |
| 2012/0279141 | A1 | * | 11/2012 | Wiederick et al. ............ 52/79.5 |
| 2013/0232888 | A1 | * | 9/2013 | Crosby, Jr. ..................... 52/79.8 |
| 2014/0058958 | A1 | * | 2/2014 | Billings ......................... 705/307 |

OTHER PUBLICATIONS

"Unistrut Ceiling Support Grids", Unistrut Service Company, accessed Jun. 26, 2014, pp. 1-3.

"Trolley Systems", Unisturt Metal Framing, accessed Jun. 26, 2014, pp. 1-3.

* cited by examiner

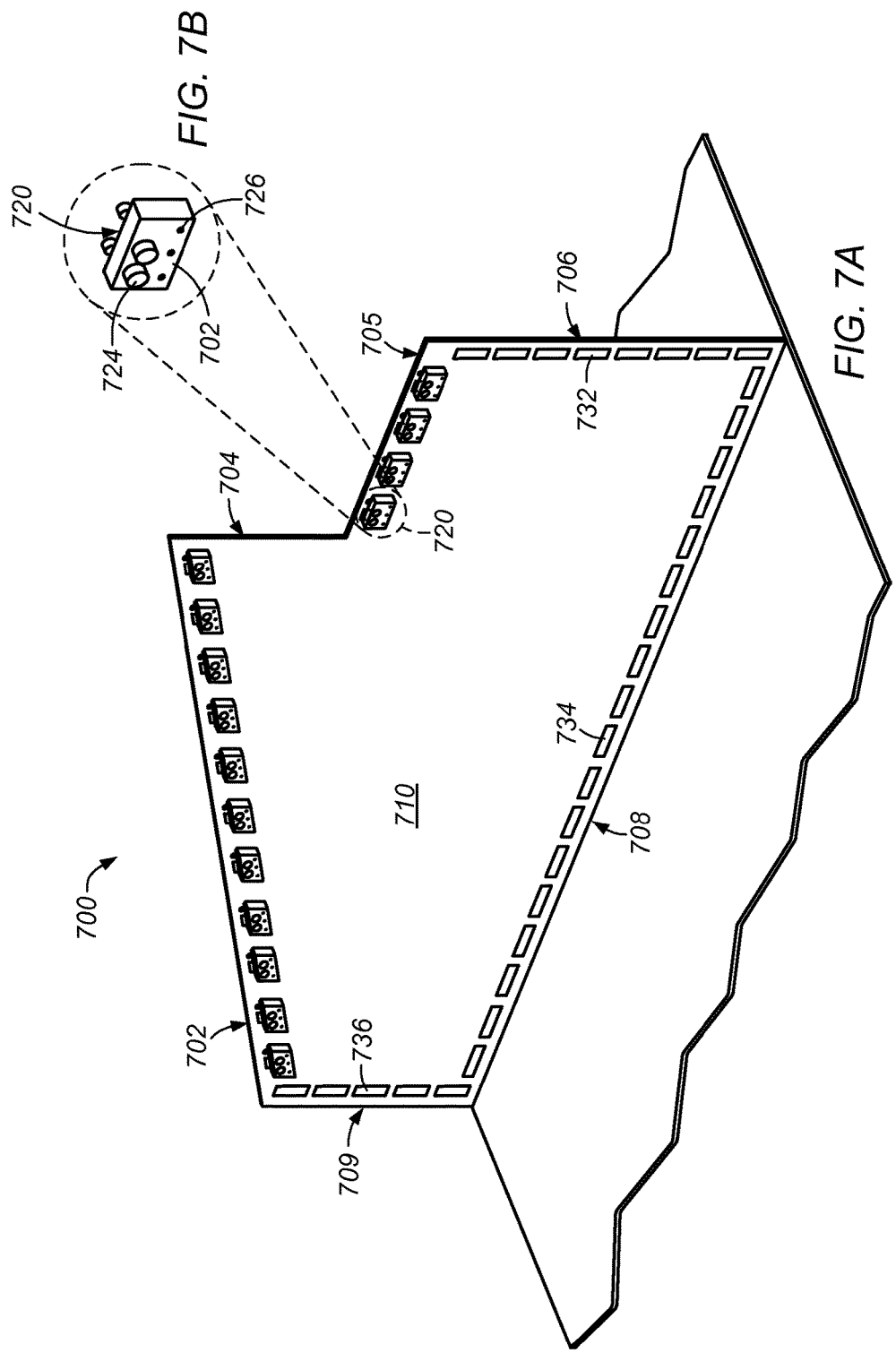

DEPLOYABLE BARRIER FOR DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Because a computing facility may contain a large number of servers, a large amount of infrastructure may be required to support computing capacity of the data center. In particular, a large amount of cabling infrastructure may be required to communicatively couple servers in a data center to communication networks, etc. Such cabling infrastructure is usually installed at initial construction of a data center as part of structured cabling infrastructure which is designed and installed in a data center to support server racks (also referred to hereinafter as "rack computer systems") that may be installed in the data center in the present or in the future.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, and cooling systems to implement waste heat removal therefrom. Additional time and resources are typically needed to conduct inspections and obtain certifications and approvals, such as for electrical and HVAC systems.

BRIEF DESCRIPTION OF THE DRAWINGS

FIG. 7A-C illustrate a view of a deployable barrier, according to some embodiments.

Figure 1:
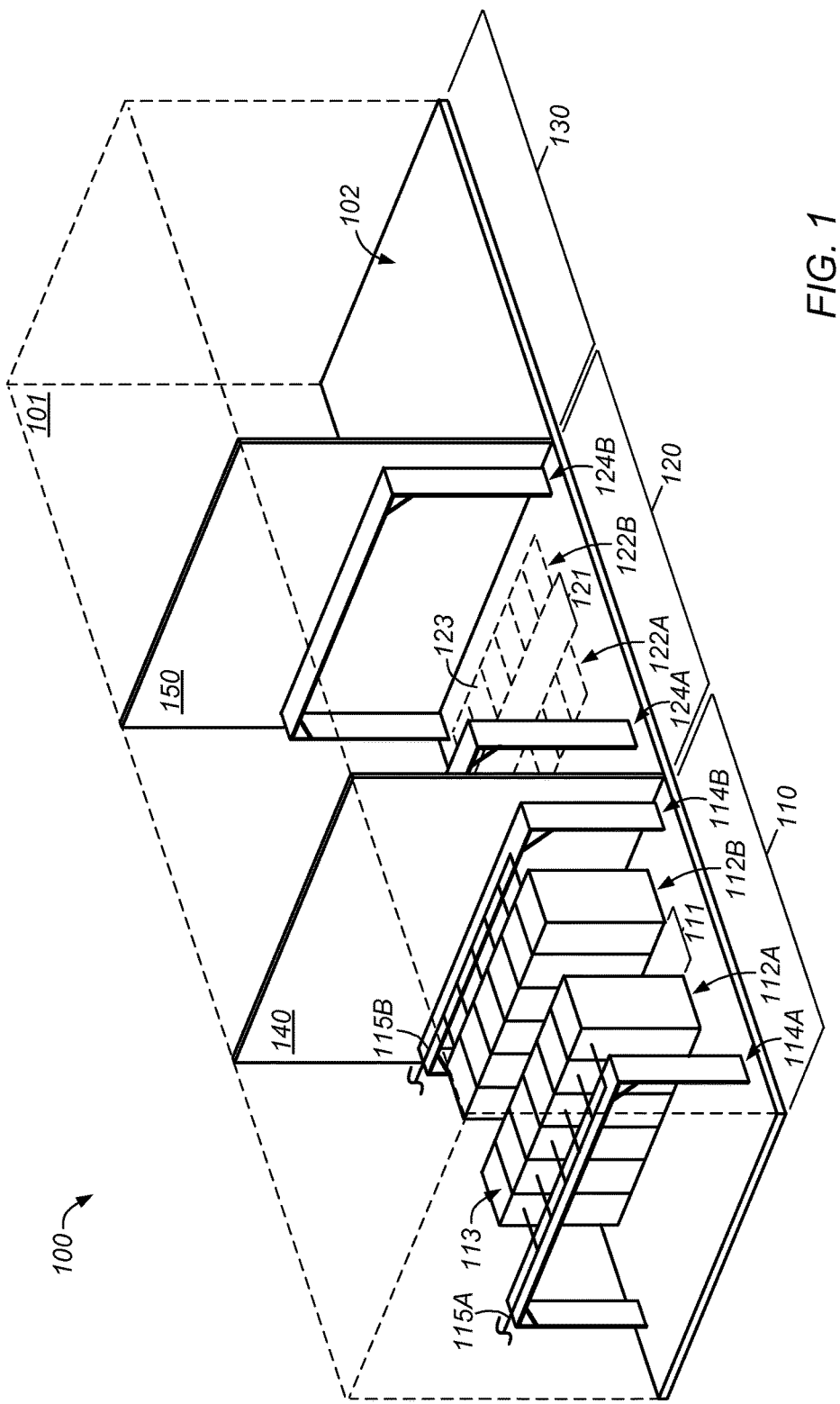
FIG. 1 is a schematic diagram illustrating a data center hall that includes rack computer systems and infrastructure installed in various partitioned areas, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular system for a data center are disclosed. According to one embodiment, a data center includes a data center hall which is partitioned into various areas. The areas include an operational area, a non-operational area, and a staging area between the operational and non-operational areas. The operational area includes installed rack computer systems provide computing capacity to perform computing operations in the data center and a set of support infrastructure supporting computing operations by the rack computer systems, where the support infrastructure can include cabling, support structure, intake and exhaust air plenums, etc. The staging area can include at least partially-installed support infrastructure and does not include rack computer systems. The staging area can be sufficiently completed to accommodate at least some of the support infrastructure and can be sufficiently incomplete to be unable to accommodate rack computer systems. The non-operational area, also referred to hereinafter as a "construction area", does not include rack computer systems or support infrastructure and is sufficiently incomplete to accommodate either. Multiple barriers are reversibly deployed in the hall to establish the partitioned area. The barriers can be reversibly deployed and re-deployed in the hall based at least in part upon incremental expansions of computing capacity in the data center hall. The barriers include an internal barrier, which partitions the operational and staging areas, and an external barrier which partitions the staging and non-operational areas. Such reversible deployment based on incremental computing capacity expansion includes at least partially re-deploying the internal barrier in the non-operational area, based at least in part upon a determination that rack computer systems are to be installed in the staging area, to incorporate the staging area into the operational area and to partition the non-operational area into an additional staging area and a remainder non-operational area.

According to one embodiment, an apparatus includes a reversibly deployable barrier which reversibly partitions a portion of a data center hall into separate areas. The reversibly deployable barrier includes a mounting element and a deployment mechanism. The mounting element reversibly mounts the barrier in the portion of a data center hall between the two separate areas to be partitioned. The deployment mechanism reversibly extends from the mounting element through an interior space of the data center hall to enable extension, through the interior space, of a collapsible partition element which reversibly partitions the portion of the data center hall into separate areas.

According to one embodiment, a method includes incrementally expanding a portion of a data center hall used to support computing operations, based at least in part upon installation of additional rack computer systems in the data center hall. The incremental expansion includes deploying barriers within the data center hall to partition the data center hall into an operational area, a staging area, and a non-operational area, and collapsing one of the barriers to incorporate the staging area into the operational area, based at least in part upon installation of an additional set of rack computer systems in the staging area, such that the operational area is expanded to include the additional set of rack computer systems and the additional set of support infrastructure. The operational area includes a set of rack computer systems and a set of support infrastructure which support computing operations by the set of rack computer systems. The non-operational area includes a portion of the data center hall that is free from including at least rack computer systems and support infrastructure. The staging area, bounded by at least two deployed barriers and located between the operational area and non-operational area, includes an additional set of support infrastructure and free from including rack computer systems.

As used herein, an "aisle" means a space next to one or more racks.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "room" means a room or a space of a structure. A "computer room" means a room in which computer systems, such as rack-mounted servers, are operated.

As used herein, a "space" means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

FIG. 1 is a schematic diagram illustrating a data center hall that includes rack computer systems and infrastructure installed in various partitioned areas, according to some embodiments.

Data center 100 includes a data center hall 101 which is partitioned into various separate areas 110, 120, 130 by barriers 140, 150. As referred to hereinafter, the data center "hall" 101 is a room of a data center which includes an interior enclosure. The data center 100, in some embodiments, comprises one or more halls 101 within a single structure. In some embodiments, a data center 100 comprises a complex of separate structures, each structure including one or more halls 101.

Data center hall 101 includes rack computer systems 113 which provide data center computing capacity. The rack computer systems which provide data center computing capacity are installed in one or more areas of the data center hall. Such installation of rack computer systems includes mounting the rack computer systems in one or more positions in the data center hall, so that the rack computer systems are structurally supported on a floor element 102 of the hall 101, electrically connected to a power source to receive operating power, and communicatively coupled to one or more communication networks with which to communicate data.

In some embodiments, one of the areas into which a data center hall is partitioned includes an "operational area", which is the area of the data center hall in which rack computer systems and support infrastructure are installed, such that the installed rack computer systems, supported by the installed support infrastructure, can perform computing operations to provide computing capacity for the data center. The operational area can be a limited, partitioned, area of the data center hall. In the illustrated embodiment, operational area 110 is a limited portion of the data center hall 101, where the operational area 110 includes two sets of rack computer systems 113 and support infrastructure installed therein. Each set of rack computer systems in the operational area 110 is a row 112A-B of installed rack computer systems 113. The rack computer systems 113 are installed in positions to establish the two rows 112A-B extending along opposite side ends of an aisle space 111, and respective sets of support infrastructure 114, 115 support a respective proximate row 112A-B of rack computer systems 113. The rack computer systems 113, installed in the operational area 110, are communicatively and electrically coupled to respective communication systems and power distribution systems via support infrastructure. Support infrastructure can include various instances of infrastructure, including structural support infrastructure, cabling infrastructure, some combination thereof, or the like.

In some embodiments, electrically coupling and communicatively coupling rack computer systems includes connecting respective power cable connections and communication cable connections with respective power interfaces and communication interfaces of the rack computer systems. Such cabling 115A-B can be referred to as the cabling infrastructure, which can be part of support infrastructure.

In some embodiments, one or more support structures 114A-B provide structural support to one or more elements supporting computing capacity in the data center. Such structural support can include at least partial structural support of other infrastructure which support computing capacity, establishing one or more air passages which circulate intake air to rack computer systems, direct exhaust air away from rack computer systems, some combination thereof, or the like. In the illustrated embodiment, for example, structural support infrastructure in data center hall 101 includes support structures 114A-B which structurally support cabling infrastructure 115A-B extended to respective rack computer systems 113 in respective proximate rows 112A-B.

In some embodiments, one or more of the partitioned areas of a data center hall 101 includes areas which are not presently suitable for providing computing capacity in the data center hall. Such areas can lack at least some of the support infrastructure which support computing operations in an operational area. In addition, some or all of the floor element 102 that is located in such areas may be at least partially incomplete, such that the portion of the floor element 102 in such areas may be structurally incapable of structurally supporting rack computer systems mounted in the floor element.

As shown in the illustrated embodiment, for example, data center hall 101 includes a non-operational area 130 which lacks rack computer systems, at least some support infrastructure, etc. As shown, support infrastructure, including support structures 114, cabling 115, etc., are not installed in non-operational area 130.

In some embodiments, a data center hall includes an area, between the operational area and non-operational area, which can include at least some support infrastructure and lacks installed rack computer system. Such an area may be in the process of being configured to accommodate and support rack computer systems. As a result, while this area may be presently in the process of preparation for installation of rack computer systems, which can include installing at least some support infrastructure in the area, rack computer systems are not presently installed in the area. This area may be referred to herein as a "staging area".

In the illustrated embodiment, data center hall 101 includes a staging area 120 where at least some support infrastructure is at least partially installed to support rack positions at least partially configured to support rack computer systems. The staging area 120 includes demarcated rack positions 123 in which rack computer systems can be mounted and structurally supported. The rack positions 123 are arranged in separate rows 122A-B extending along opposite side ends of an aisle space 121. In some embodiments, the portion of floor element 102 included in staging area 120 is distinct from the portion of floor element 102 included in non-operational area in that the portion of the floor element 102 in the staging area 120 can structurally support rack computer systems, were such systems to be installed in one or more of the rack positions 123. For example, a complete floor element 102 portion in the operational area 110 and staging area 120 includes a concrete surface which can structurally support rack computer systems on the concrete surface. In contrast, the portion of floor element 102 in non-operational area 130 may at least partially lack a concrete surface, so that the non-operational area 130 is at least partially incapable of structurally supporting rack computer systems, support infrastructure, etc. on the portion of floor element 102 in the non-operational area.

In some embodiments, the various separate areas of a data center hall are partitioned from each other by one or more barriers. A barrier can include one or more partition elements which extend through a portion of the data center hall, including a cross sectional plane extending through the volume space of the hall, to restrict one or more of particulate matter circulation, air flow, etc. between the partitioned areas bounded by the opposite sides of the partition element extending through the plane. In the illustrated embodiment, for example, data center hall 101 includes barriers 140, 150 which partition the hall 101 into separate areas 110, 120, 130. Barrier 140 partitions the operational area 110 and staging area 120 from each other, and barrier 150 partitions the staging area 120 and the non-operational area 130 from each other. In some embodiments, staging area 120 is at least partially established based at least in part upon the barriers 140, 150, such that the staging area 120 is at least partially bounded by the barriers 140, 150.

In some embodiments, the various portions of the data center hall are reversibly partitioned into the various areas. Such reversible partitioning can include changing the partitioning of the data center. Changing the partitioning can include expanding some area, incorporating some areas into other areas, partitioning some areas into additional areas, etc. In some embodiments, the partitioning of the data center hall is changed based at least in part upon changes in determinations that computing capacity is to be changed through the addition, removal, replacement, etc. of rack computer systems in the data center hall. For example, barriers can be reversibly deployed in the data center hall to expand the size of the operational area to include an expanded portion of the data center hall, so that the expanded operational area can accommodate additional installed rack computer systems. In some embodiments, expanding an operational area includes collapsing a deployed barrier to incorporate one or more other areas, including a staging area, into the operational area.

Figure 2A:
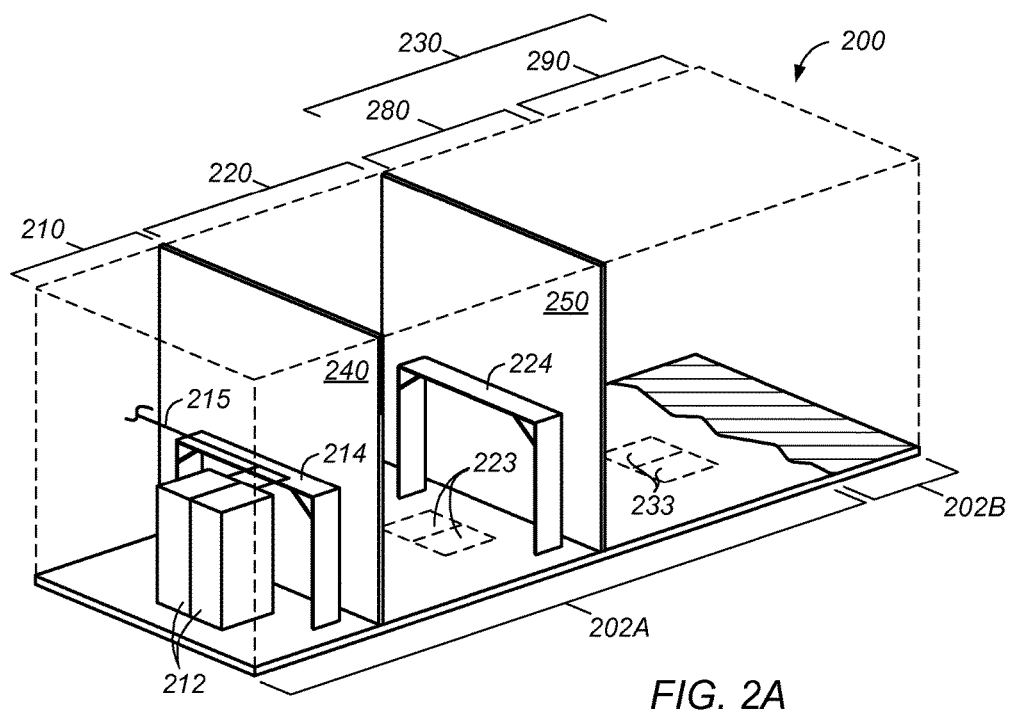
FIG. 2A-B are schematic diagrams illustrating expansion of an operational area in a data center hall, according to some embodiments.
Figure 2B:
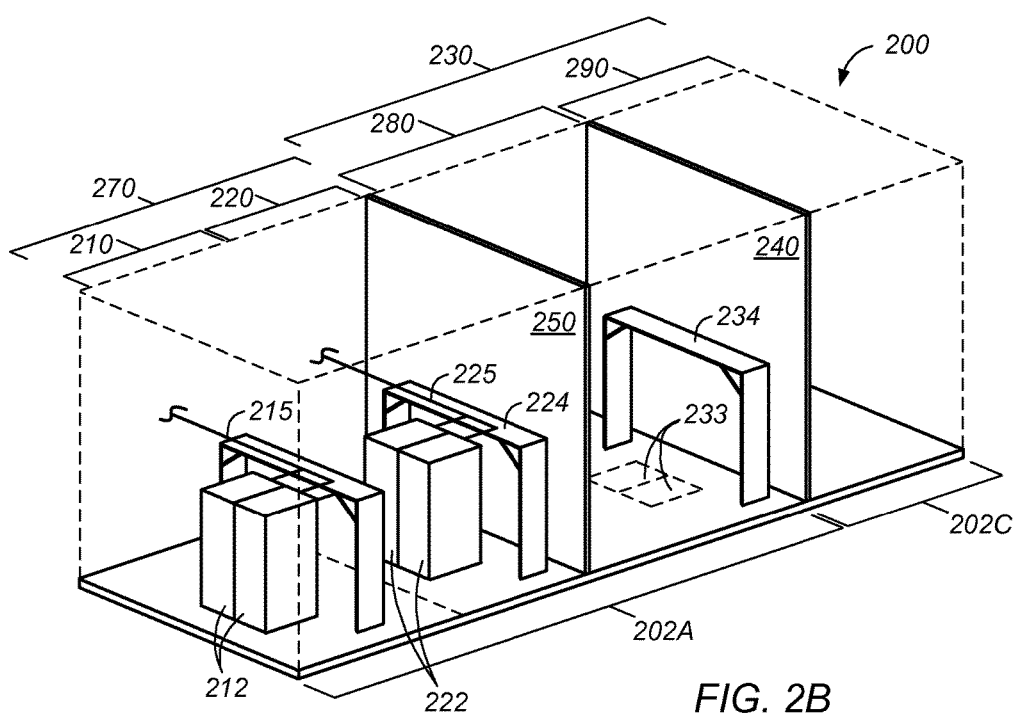

FIG. 2A-B are schematic diagrams illustrating expansion of an operational area in a data center hall, according to some embodiments. The expansion can be based at least in part upon a determination that additional computing capacity is required for the data center, which can include a determination that additional rack computer systems are to be installed in the data center hall to provide additional data center computing capacity. In some embodiments, the expansion is based at least in part upon a determination that a staging area is configured to support one or more rack computer systems in the data center hall.

FIG. 2A illustrates a data center hall 200 partitioned into separate areas 210, 220, 230 by barriers 240, 250. Operational area 210 includes installed rack computer systems 212 which are supported by installed structural support infrastructure 214 and cabling infrastructure 215 and provide computing capacity for a data center which includes data center hall 200.

In some embodiments, computing capacity is installed incrementally in a data center hall over time. Such incremental installation of computing capacity can include incremental installation of rack computer systems and support infrastructure which supports the installed rack computer systems over time. Incremental installation of computing capacity can include installation of rack computer systems which provide a certain amount of computing capacity, based at least in part upon a determination that the certain amount of computing capacity is required to be added to the data center hall to satisfy present or imminent demand for computing capacity, where imminent demand includes demand which will be present demand after a period of elapsed time approximating a period of time required to install the additional rack computer systems and support infrastructure not already installed at the time of the determination.

Because computing capacity is added to the data center hall incrementally over time, the portion of the data center hall in which rack computer systems and support infrastructure providing the computing capacity are located may be less than the entirety of the data center hall, and such a portion of the data center hall may expand over time to approach including the entirety of the data center hall as additional rack computer systems and support infrastructure are installed. As a result, portions of the data center hall which do not include rack computer systems and support infrastructure may be in an "unimproved" condition, where the portions of the data center are unable to presently support rack computer systems and support infrastructure. As computing capacity is added incrementally to the data center hall, unimproved portions of the data center may be incrementally "improved" to configure the data center portions to accommodate and support rack computer systems, support infrastructure, some combination thereof, or the like.

As shown in FIG. 2A, data center hall 200 includes floor elements 202A-B which extend throughout the data center hall 200. Floor element 202A, which can include a finished concrete surface, can structurally support rack computer systems, support infrastructure, etc. in the data center hall 200. Floor element 202B, which can include an unfinished surface that is not a finished concrete surface, cannot structurally support rack computer systems, support infrastructure, etc. In some embodiments, as the computing capacity is expanded incrementally in the data center hall 200, the floor element 202B may be incrementally modified, through pouring a forming concrete, etc., to incrementally convert portions of the floor element 202B into floor element 202A. Such incremental modification can include modifying portions of floor element 202B that are proximate to portions of the data center hall 200 in which a next addition of rack computer systems, support infrastructure, etc. is to occur.

In some embodiments, modification of a floor element 202B in a non-operational area 230 of a data center hall 200 is at least part of an incremental construction process, whereby the data center hall 200 is incrementally configured to support rack computer systems, support infrastructure, etc. The incremental configuration can occur in discrete portions of the data center hall that can support a discrete set of rack computer systems, support infrastructure, etc. The incremental configuration, which can include finishing a floor element to configure it to support rack computer systems, installing support infrastructure, etc., may occur based at least in part upon a determined need to add computing capacity, a determined need to configure a portion of the data center to accommodate at least some support infrastructure, etc.

In some embodiments, a portion of the data center is at least partially improved, relative to the non-operational area 230, and is at least partially configured to support rack computer systems. Such a portion is referred to herein as a "staging area" 220, which is partitioned from both the operational area and non-operational area and is bounded by barriers 240, 250. Such an area can provide a "buffer" area between the operational area and non-operational area, and such an area can be configured to fully support rack computer systems in at least partial isolation from the non-operational area. For example, where at least a portion of the non-operational area 230 include unimproved floor element 202B where concrete is being poured, etc., particulate matter may circulate through the non-operational area, and partitioning the staging area from the operational area can enable final configuration of the area for supporting rack computer systems, similarly to operational area 210, while mitigating construction materials, particulate matter, various contaminants, etc. from circulating to the staging area 220. Such contaminants, which can damage rack computer systems, may be required to be cleared from an operational area to mitigate the risk of such damage. Thus, establishing a staging area between the operational area and non-operational area allows an area to be prepared for incorporation into the operational area with minimal contamination from construction activities, improvement activities, etc. in the non-operational area. In addition, staging area 220, being located between operational area 210 and non-operational area 230 and bounded by barriers 240, 250, can serve as a buffer between operational area 210 and non-operational area 230, thereby mitigating a risk of contamination of operational area 210 by particulate matter, other contaminants, etc.

Staging area 220 includes a portion of floor element 202 upon which a set of rack positions 223 which can structurally support one or more rack computer systems are established. Staging area 220 also includes a support structure 224, which is a portion of the support infrastructure required to support rack computer systems in rack positions 223. As shown, cabling infrastructure 215, present in operational area 210 to support rack computer systems 212, is absent from staging area 220. Such cabling infrastructure may be added to at least partially complete configuration of staging area 220 to support rack computer systems in rack positions 223. Upon completion of such configuration of staging area 220, staging area 220 may be fully configured to support rack computer systems in rack positions 223, and the remaining steps to enable the portion of data center hall 200 encompassed by staging area 220 to provide computing capacity can include mounting rack computer systems in one or more of the rack positions 223 and coupling the mounted rack computer systems to at least some of the support infrastructure, including cabling infrastructure installed in staging area 220.

Because computing capacity is added to the data center hall incrementally over time, the portion of the data center hall in which rack computer systems and support infrastructure providing the computing capacity are located may be less than the entirety of the data center hall, and such a portion of the data center hall may expand over time to approach including the entirety of the data center hall as additional rack computer systems and support infrastructure are incrementally installed over time. In the illustrated embodiments of FIG. 2A-B, the operational area 210 is such a portion of the data center hall, and expanding the computing capacity in the data center hall 200 can include expanding the operational area 210 within the data center hall 200.

In some embodiments, expanding an operational area in a data center hall, where the data center hall is partitioned into separate areas based at least in part upon deployment of various barriers in the hall, includes reversibly deploying and collapsing barriers in the hall to change the partitioning of the data center hall. Such changing can include collapsing a barrier which initially partitions a portion of a data center hall into two separate areas, so that one area is incorporated into another area based at least in part upon the collapsing of the barrier. In addition, an area can be partitioned into additional areas based at least in part upon deploying a barrier in the initial area to partition it into separate areas. A barrier deployed to partition one area of a data center hall can be a barrier previously collapsed to incorporate two other separate areas of the data center hall, where the collapsed barrier is relocated to the subsequent area and re-deployed to partition the area.

FIG. 2B illustrates data center hall 200, where barrier 240 is re-deployed from a position between areas 210 and 220 to being deployed in non-operational area 230, thereby incorporating staging area 220 into operational area 210 to establish an expanded operational area 270 and partitioning non-operational area 230 into an additional staging area 280 and a remainder non-operational area 290.

In some embodiments, reversibly deploying barriers to incorporate a staging area into an operational area to expand the operational area is based at least in part upon a determination that the staging area is fully configured to support installed rack computer systems to provide computing capacity for the data center. In some embodiments, reversibly deploying barriers to incorporate a staging area into an operational area to expand the operational area is based at least in part upon a determination that rack computer systems are to be installed in rack positions in the staging area. For example, upon a staging area 220 being fully configured to support rack computing systems, barrier 240 may remain deployed, partitioning staging area 220 from operational area 210, until a determination is made that rack computer systems are to be installed in rack positions 223 in area 220 to satisfy a demand for additional computing capacity, upon which barrier 240 may be collapsed. In some embodiments, a fully-configured staging area lacks at least some support infrastructure, including some cabling infrastructure, including cabling infrastructure, which is installed concurrently with a determination that rack computer systems are to be installed in the staging area, concurrently with mounting rack computer systems in the staging area, etc.

As shown in FIG. 2B, staging area 220 includes support structure 224, cabling 225, and installed rack computer systems 222. In some embodiments, barrier 240 is collapsed between areas 210 and 220 subsequent to installation of rack computer systems 222 in staging area 220. As barrier 240 is collapsed between areas 210 and 220, staging area 220 is incorporated into operational area 210 to establish an expanded operational area 270 which encompasses an expanded portion of data center hall 200 and supports an expanded computing capacity, relative to operational area 210.

As shown in FIG. 2B, barrier 240 is relocated into non-operational area 230 and deployed in a position therein. Such deployment results in barrier 240 partitioning non-operational area into areas 280 and 290. Area 280 may be referred as an additional staging area, and barrier 240 can be positioned and deployed in a particular location of non-operational area 230, such that area 280 includes a portion of floor element 202A which is configured to structurally support rack computer systems on established rack positions 233. In addition, at least some support infrastructure, including the illustrated support structures 234, can be installed in the additional staging area 280 to prepare the area 280 to be fully configured to support rack computer systems in positions 233.

Area 290 may be referred to as a remainder non-operational area, and may remain, at least temporarily, at last partially in an unimproved state. In some embodiments, barrier 240 is positioned in area 230 to partition an improved portion of area 230 into staging area 280 and the unimproved portion of area 230 into non-operational area 290. Area 290 can, subsequently to the deployment of barrier 240 in area 230, be at least partially improved, so that a portion of area 290 can be subsequently partitioned into additional staging areas and non-operational areas. Such at least partial improvement can include at least partially improving floor element 202B into floor element 202C to configure the floor element to structurally support rack computer systems mounted on the floor element 202C.

Area 280 is bounded by barriers 240 and 250 and is located between the expanded operational area 270 and the remainder non-operational area 290. In some embodiments, a barrier 240, 250 partitioning an operational area and a staging area is referred to as an "internal deployable barrier", "internal barrier", etc., while a barrier partitioning a staging area and a non-operational area is referred to as an "external deployable barrier", "external barrier", etc.

Figure 3:
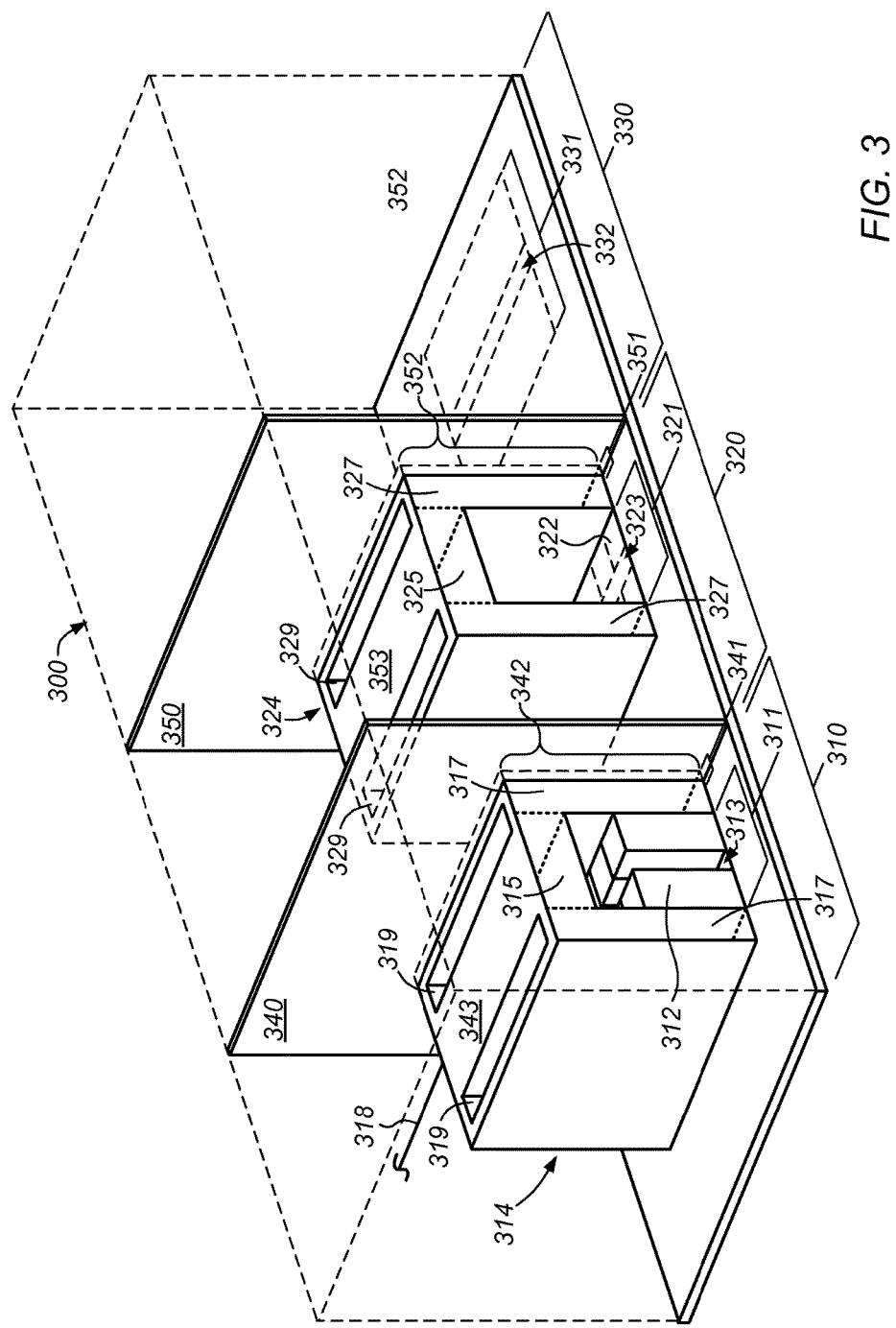
FIG. 3 is a schematic diagram illustrating a data center hall that includes rack computer systems and infrastructure installed in various partitioned areas, according to some embodiments.

FIG. 3 is a schematic diagram illustrating a data center hall that includes rack computer systems and infrastructure installed in various partitioned areas, according to some embodiments.

In some embodiments, support infrastructure installed in a data center hall to support rack computer systems includes one or more infrastructure "modules", also referred to herein as computer room modules, in which rack computer systems are installed, where the modules provide at least some establishing and containment of air plenums, directing of cooling air, exhaust air with respect to the rack computer systems, etc. Configuring a staging area to fully support rack computer systems can include assembling a module in the area, installing cabling infrastructure, power distribution infrastructure, etc. in the module, etc. In some embodiments, a module is assembled in a portion of a non-operational area prior to partitioning that portion into an additional staging area. In some embodiments, at least a portion of an assembled module at least partially partitions two separate areas of a data center hall, in cooperation with a deployed barrier. For example, where a module has an upper end which is less than a full ceiling height towards a roof structure of a data center hall, a barrier may be mounted on the upper end and deployed from the module upper end towards the roof structure, such that a side wall element of the module and the deployed barrier collectively partition a portion of the data center hall into separate areas.

In the illustrated embodiment, data center hall 300 includes operational area 310, staging area 320, non-operational area 330, and barriers 340, 350. Data center hall 300 also includes computer room modules 314, 324 at least partially located in the operational area 310 and staging area 320, respectively. Non-operational area 330 includes an established footprint 331 upon which a computer room module can be assembled in the non-operational area 330.

As shown, a computer room module 314, 324 can include an aisle space 311, 321 in which rack computer systems 312 can be installed in one or more rack positions 322. An aisle 313, 323 can extend along a length of the aisle space 311, 321, such that rack positions, rack computer systems, etc. extend in rows along one or more side ends of the aisle.

As noted above, some computer room modules include structures which establish and contain plenums through which air is directed. In the illustrated embodiment, modules 314, 324 include respective cooling air plenums 315, 325 and exhaust air plenums 317, 327. Cooling air plenums can receive cooling air from one or more air sources 318 and direct cooling air into an aisle space in which rack computer systems are installed to provide cooling air to remove heat from heat producing components of the rack computer systems. Such cooling air, upon removing such heat, may be discharged from the rack computer systems into an exhaust plenum 317, 327, which can direct the exhaust air out of the module 314, 324 via exhaust air vents 319, 329, which can be included in an upper end (i.e., "top end") of the respective module 314, 324. Exhaust air can pass from a module into the hall 300 via an exhaust vent based at least in part upon an air density gradient from the plenum 317, 327, towards the hall 300.

As shown, a module 324 which is at least partially located in a staging area 320 may be at least partially configured to support rack computer systems in the rack positions 322 of the module 324. The module 324 may be further configured to support rack computer systems while the module 324 is included in a staging area 320 and prior to the staging area 320 being incorporated into an operational area 310, including removing contaminants from the module, installing additional support infrastructure, which can include power distribution infrastructure including power busways through aisle space 321, cabling infrastructure, etc.

As shown, barriers 340, 350 at least partially partition separate areas of the data center hall 300 and collectively partition separate areas with respective side wall elements of respective modules 314, 324. Barrier 340 is shown to extend along a portion of module 314, so that a portion 341 of module 314 is included in the staging area 320 and a side wall element 342 of module 314 at least partially partitions area 310 and 320. Similarly, barrier 350 is shown to extend along a portion of module 324, so that a portion 351 of module 324 is included in the non-operational area 330 and a side wall element 352 of module 324 at least partially partitions area 320 and 330. In some embodiments, to collectively partition separate areas of a data center with a side wall element of a computer room module, a barrier 340, 350 is mounted on a top end 343, 353 of a module 314, 324 and deployed from the top end into at least a portion of the hall 300 which extends above the top end 343, 353 towards a roof structure of the hall 300.

Figure 4:
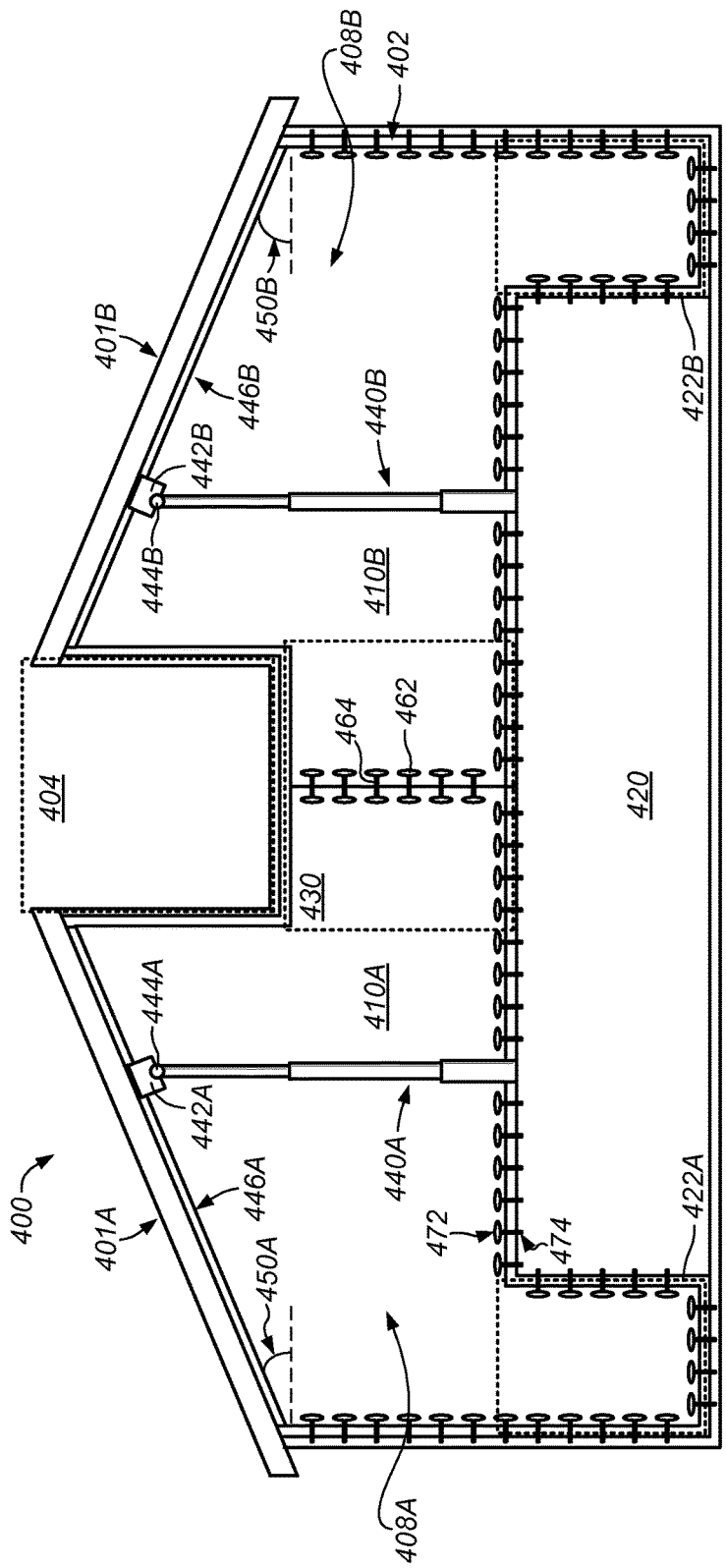
FIG. 4 is a cross sectional view of a portion of a data center hall including deployed barriers, according to some embodiments.

FIG. 4 is a cross sectional view of a portion of a data center hall including deployed barriers, according to some embodiments.

In some embodiments, a deployable barrier is a barrier assembly which includes multiple components, at least some of which can be reversibly deployed into portions of a data center hall to partition portions of the data center hall into separate areas.

In some embodiments, a deployable barrier includes a deployment mechanism which reversibly extends through an interior space of a data center hall to enable extension, through the interior space, of a collapsible partition element which reversibly partitions the portion of the data center hall into at least two separate areas. The deployment mechanism can include a reversibly extendible mast structure, including a telescoping mast structure, pneumatically-extendable mast, etc. which can extend from a collapsed configuration into a deployed configuration.

In some embodiments, a deployment mechanism includes a boom support element, on an extendible end of the deployment mechanism, which can support a partition boom structure from which a collapsible partition element can be extended. Deployment of a deployable barrier can include the deployment mechanism, including an extendible mast structure, extending a boom support element, on the extendible end, through an interior space of a data center hall, where a collapsible partition element is extended from the partition boom structure supported by the boom support element to partition a portion of the data center hall.

In some embodiments, multiple deployable barriers are deployed in a portion of a data center hall, where each deployable barrier partially partitions the portion of the data center hall and the multiple deployable barriers collectively partition the portion of the data center hall. The multiple deployable barriers can be at least partially coupled together, when in a deployed configuration.

In the illustrated embodiment, data center hall 400 includes an interior space 402 in which a computer room module 420 is located. Two separate deployable barriers 408A-B are deployed in the interior space 402 to collectively, with a side wall element of computer room module 420, partition a portion of the data center hall 400 into separate areas. As shown, each barrier 408 includes a respective deployment mechanism 440A-B which includes a reversibly extendible mast structure. Each mechanism 440A-B includes a boom support element 442A-B on extendible ends of the deployment mechanisms 440A-B. Partition boom structures 446A-B are supported by each of the boom support elements 442A-B, and pivots on each of the respective extendible ends 444A-B of the respective deployment mechanisms 440A-B can enable the boom support elements 442A-B to pivot, thus enabling pivoting of the respective partition boom structures supported by the respective boom support elements 442A-B.

Deployment of each of the barriers 408A-B can include extending the respective deployment mechanisms 440A-B through the interior space 402 from the top end of computer room module 420 towards respective roof structures 401A-B of the data center hall 400. Extending a deployment mechanism 440 can include extending a partition boom structure 446 through the interior space on a boom support element 442 at an extendible end 444A of the deployment mechanism 440. As shown, the roof structures 401A-B are angled according to respective angles 450A-B. In some embodiments, each extendible end 444 includes one or more pivots which enable the boom support element 442, and thereby the supported partition boom structure 446, to pivot when a portion of the partition boom structure 446 contacts a portion of an angled roof structure 401, so that a partition boom structure 446 supported at an extendible end of a deployment mechanism 440 is held flush against a respective roof structure 401 at an angle corresponding to the angle 450 of the roof structure 401.

A collapsible partition element 410 is extended from each partition boom structure 446 of each barrier 408 to at least partially partition a portion of an interior space 402. In some embodiments, a partition element 410, in a collapsed configuration, is included in the partition boom structure and is extended downwards from the partition boom structure 446 when the partition boom structure 446 is supported at an extendible end of a deployment mechanism 440 in a deployed configuration to put the partition element 410 in a deployed configuration. In some embodiments, the deployment is implemented through force of gravity. In some embodiments, a partition element 410 is extended based at least in part upon operation of one or more pulley systems.

In some embodiments, a partition element 410 includes irregular portions which extend to partition irregular portions of a data center hall interior space. For example, interior space 402 includes areas 422A-B and 430, caused by computer room module 420 and irregular roof structure portion 404, and partition element 410 can include portions which extend to partition the irregular areas.

Each partition 410 includes coupling elements which couple the partition element to various structures, separate partition elements, etc. to at least partially enable the partition element to partition the interior space 402. In the illustrated embodiment, each partition element 410 includes side coupling elements 462 and bottom coupling elements 472. In some embodiments, elements 462 and 472 are hook and loop fasteners which couple to each other, other separate coupling elements, etc. to couple the partition elements to separate structures. For example, elements 462 are coupled to each other via coupling elements 464. In addition, elements 472 are coupled with computer room module 420 via coupling elements 474. As shown, in some embodiments a partition element 410 can be coupled to a side wall element, floor element, etc. of the data center hall 400.

Figure 5A:
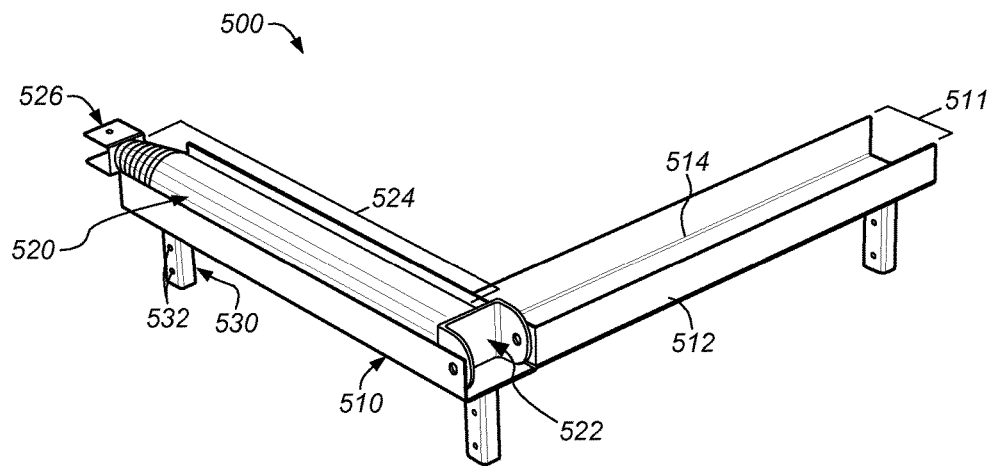
FIG. 5A-E illustrate a deployable barrier, including an extendible mast and mounting element, according to some embodiments.

FIG. 5A illustrates a deployable barrier, including an extendible mast and mounting element, according to some embodiments. Deployable barrier 500 includes a mounting element 510 and a deployable mechanism 520.

Deployment mechanism 520 includes a reversibly extendible mast 524, boom support element 526 and mast support 522 which couples the mast 524 to the mounting element 510. The deployable barrier 500 illustrated in FIG. 5A is in a collapsed configuration, where at least a portion of deployment mechanism 520 is in a collapsed configuration. The illustrated collapsed configuration of deployment mechanism 520 includes extendible mast 524 lying, in a primarily horizontal configuration, flush with a channel structure 511 of the mounting element, at least partially established by side wall elements 512, so that the reversibly extendible mast lies at least partially within the channel structure 511. In addition, extendible mast 524 is in a collapsed configuration. Where extendible mast 524 includes multiple telescoping portions, as illustrated in FIG. 5A, a collapsed extendible mast includes the multiple telescoping portions being at least partially collapsed within each other.

Mounting element includes boss structures 530, which can couple with one or more portions of a data center to mount the deployable barrier 500 on the one or more portions. As described further below, a boss structure 530 can insert on, over, into, etc. a vertical structural element of a computer room module, including a primarily vertical structural member. In addition, boss structures 530 include pin holes 532 which can receive pin elements through the holes to secure the respective boss structures in a portion of a data center, including a vertical structural member of a computer room module, on which the boss structure 530 is mounted.

As shown, deployment mechanism 520 includes a boom support element 526 which, in the collapsed configuration of deployable barrier 500, does not support a partition boom structure. In some embodiments, the boom support element does support a partition boom structure when the deployable barrier 500 is in a collapsed configuration. In addition, deployable barrier includes one or more brace structures 514 which are stowed in various portions of the channel structure 511 when the deployable barrier 500 is in the collapsed configuration.

In some embodiments, a deployable barrier 500 in a collapsed configuration, as shown in FIG. 5A, can be dismounted from various portions of a data center hall, relocated to other portions of the data center hall, and mounted and deployed in such other portions of the data center hall. In addition, a deployable barrier can be reversibly deployed, collapsed, relocated, etc. to change partitioning of portions of the data center hall into separate areas.

Figure 5B:
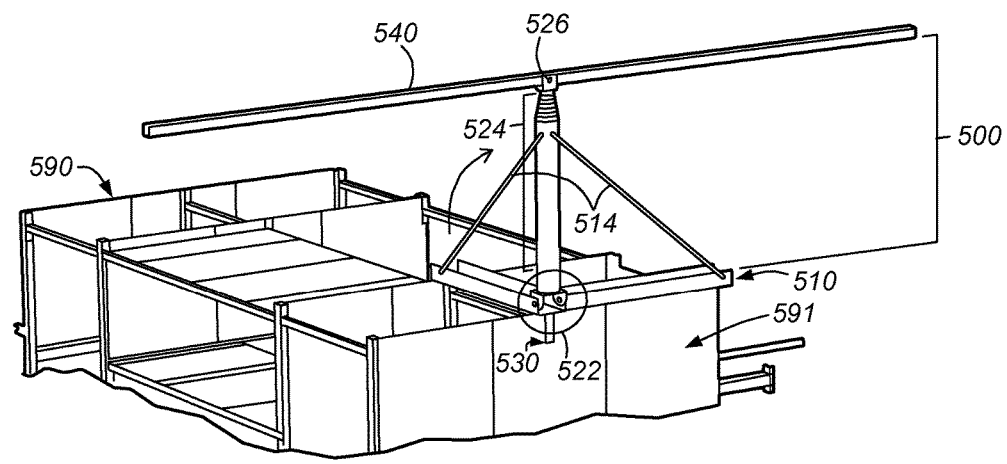

FIG. 5B illustrates a deployable barrier mounted on a computer room module and rotated to an extending configuration, according to some embodiments.

As shown, deployable barrier 500 is mounted on a computer room module and at least partially deployed. Various portions of mounting portion 510, including boss structures 530, are mounted on a top end of the computer room module 590. In particular, boss structures 530 are inserted into the vertical structural members 591, which can be hollow vertically-oriented tube structures. Pins can be interested through the members 591, and the bosses inserted in such members via pin holes 532, to secure the mounting portion 510 to the computer room module 590.

Deployable barrier 500 in a partially deployed configuration, as shown in FIG. 5B, includes at least a portion of the deployment mechanism, particularly the reversibly extendible mast 524 with boom support element 526 on an extendible end of the mast 524, rotated, based at least in part upon rotation of mast support 522, to a primarily vertical orientation. Braces 514 can be deployed from stowed configurations to structurally stabilize and support the mast 524 in the primarily vertical orientation, as shown in the illustrated embodiment.

Partition boom structure 540 is supported on boom support element. Such support can include coupling the partition boom structure to a coupling element of the boom support element. In the illustrated embodiment, boom support element 526 includes a channel structure, and partition boom element 540 is supported in the channel structure of boom support element 526. In some embodiments, a pin is inserted through the partition boom structure 540 and boom support element 526 to secure the partition boom structure in place on the boom support element 526. In some embodiments, partition boom structure 540 includes a collapsible partition element that is in a collapsed configuration. In some embodiments, partition boom structure 540 as shown in FIG. 5B does not include a partition element.

Figure 5C:
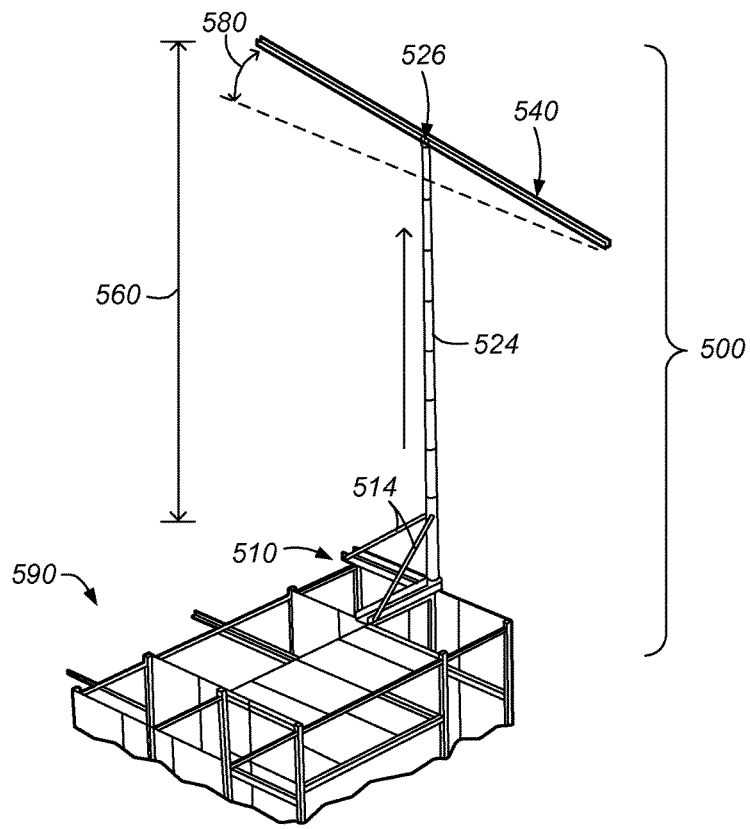

FIG. 5C illustrates a deployable barrier mounted on a computer room module and extended to a deployed configuration, according to some embodiments.

Deployable barrier 500 is at least partially deployed into a deployed configuration, where deployment mechanism is extended to a fully-deployed configuration. As shown in the illustrated embodiment, where deployment mechanism includes a reversibly extendible mast structure 524, the reversibly extendible mast structure 524 is extended to a fully-extended configuration to deploy the deployment mechanism into a fully-deployed configuration. In some embodiment, extending of the reversibly extendible mast structure 524 is based at least in part upon a pneumatic system, which can include an air pump, which supplies a pressurized fluid into an interior of the reversibly extendible mast structure 524 to extend the mast into the fully-extended configuration. As shown, extending the reversibly extendible mast structure 524 includes extending the reversibly extendible mast structure 524 upwards from the top end of the computer room module 590 and through a distance of an interior space 560 above the top end of computer room module 590, so that the partition boom structure 540 supported by a boom support element 526 on an extendible end of the mast 524 is extended through the distance of the interior space 560.

Deployment of each of the barrier 500 can include extending the reversibly extendible mast 524 through the interior space 560 from the top end of computer room module 590 towards a roof structure at a top end of interior space 560. Extending a mast 524 can include extending the partition boom structure 540 through the interior space 560 on the boom support element 526 at an extendible end of the mast 524. In some embodiments, where the roof structure is angled according to an angles 580, a pivot on the extendible end of the mast 524 enables the boom support element 526, and thereby the supported partition boom structure 540, to pivot when a portion of the partition boom structure 540 contacts a portion of an angled roof structure, so that a partition boom structure 540 supported at an extendible end of the mast 524 is held flush against a roof structure at an angle corresponding to the angle 580 of the roof structure.

Figure 5D:
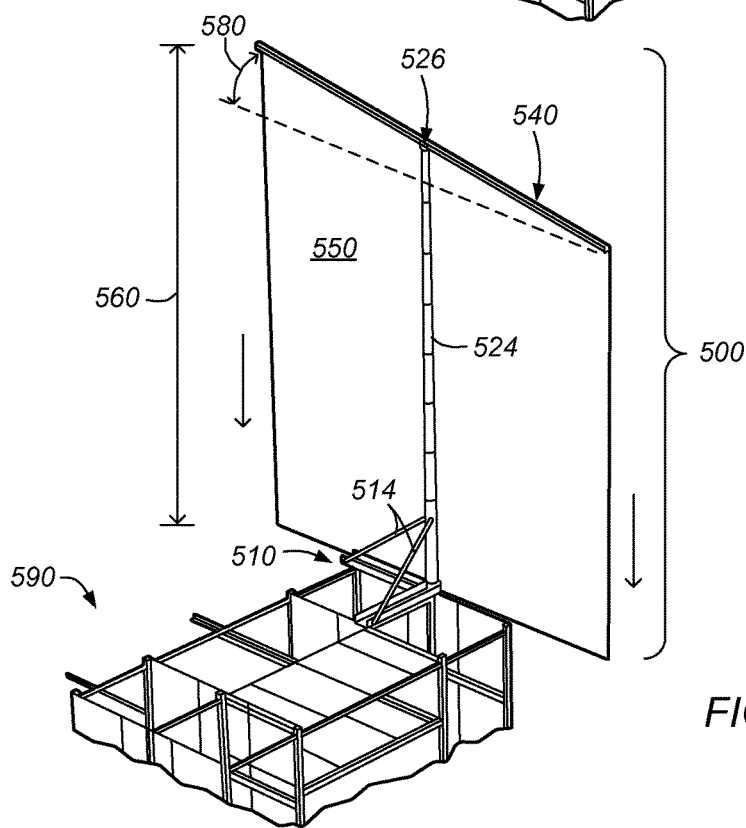
Figure 5E:
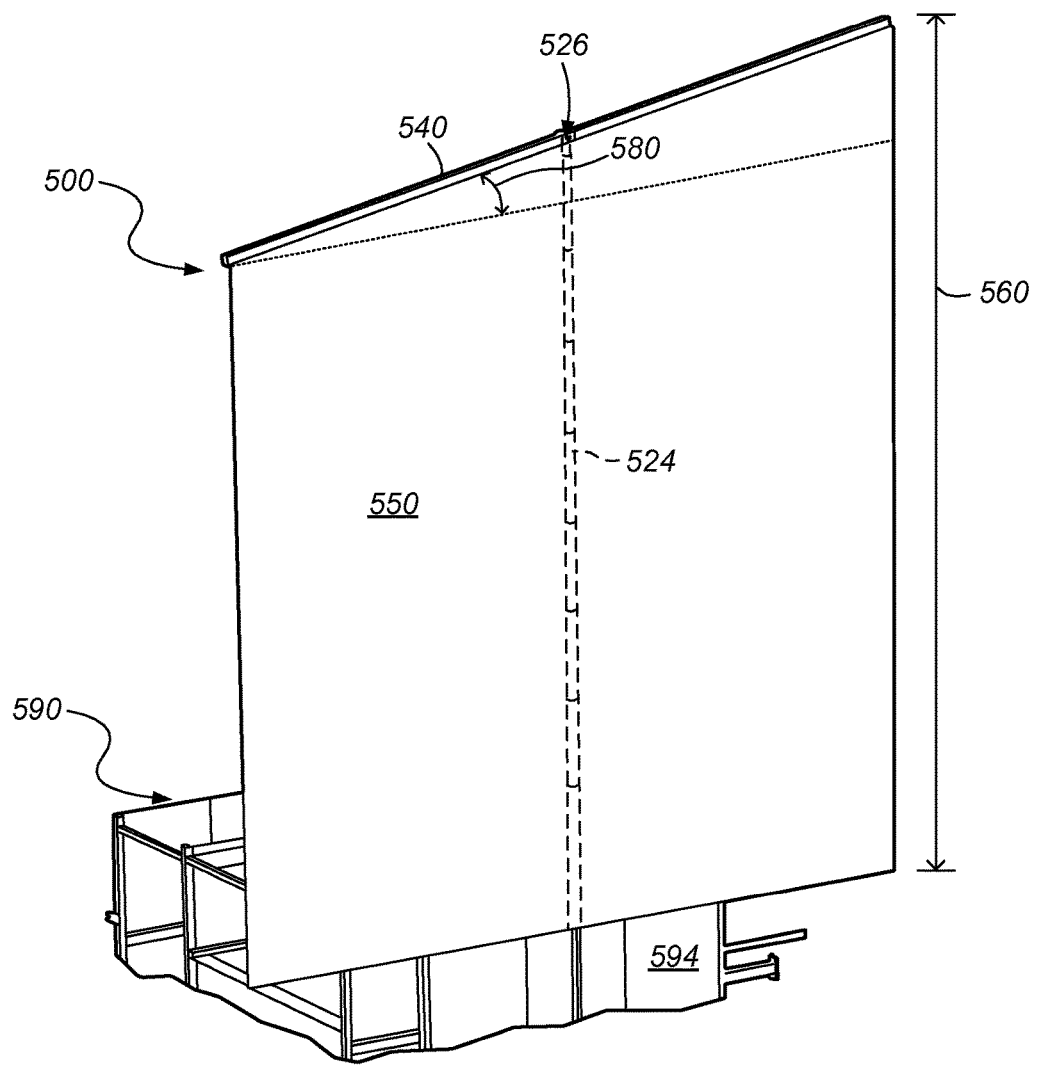

FIG. 5D-5E illustrate a deployable barrier with an extended partition, according to some embodiments.

Deployable barrier 500 includes a partition element 550 extended between partition boom structure 540 and computer room module 590, through interior space 560, to partition interior space 560 into separate areas. In some embodiments, partition element 550 is extended, from a collapsed configuration, from the partition boom structure 540 downwards towards the mounting element 510. In some embodiments, the partition element 550 extends down, in a deployed configuration, to an elevation matching that of the mounting element 510. In some embodiments, the partition element 550 extends downwards to at least the top end of the module 520.

In some embodiments, a collapsible partition element 550 extended to a deployed configuration at least partially partitions a portion of a data center hall. As shown, the deployed partition element extends through interior space 560, thereby partitioning that space 560. In addition, as deployable barrier 500 is mounted on a top end of computer room module 520, deployed partition element 550 can partition a portion of the data center hall collectively with a side wall element 594 of the computer room module upon which the barrier 500 is mounted.

As shown, partition element 550 extends from an angled partition boom structure 540 to a horizontally-oriented top end of module 520. In some embodiments, including the illustrated embodiment, partition element 550 can be adjustably extended so that the extended partition element 550 lies flush with a top end of the computer room module 520, a floor element surface, etc., even though the partition boom structure is held flush with a roof structure at an angle 580.

Figure 6:
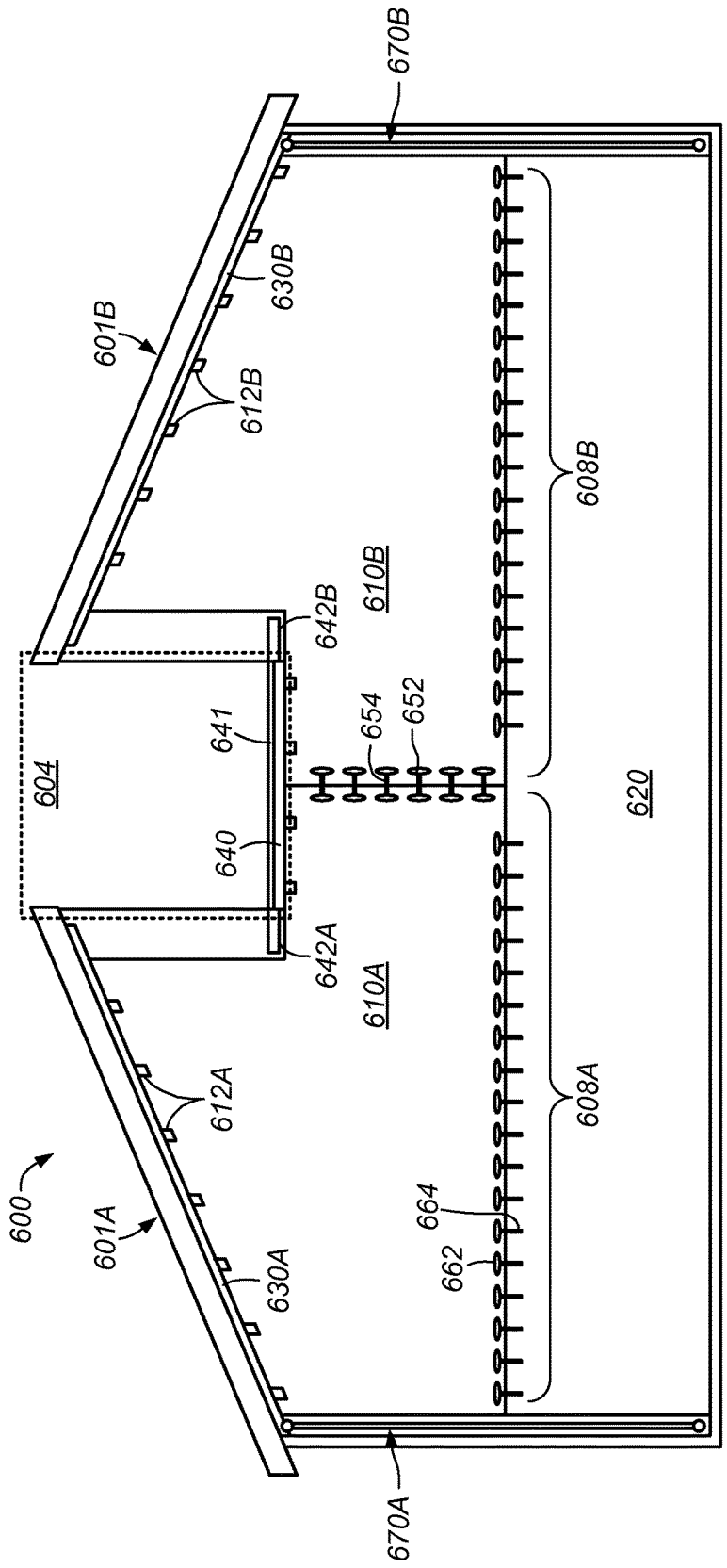
FIG. 6 is a cross sectional view of a portion of a data center hall including deployed barriers, according to some embodiments.

FIG. 6 is a cross sectional view of a portion of a data center hall including deployed barriers, according to some embodiments.

In some embodiments, a deployable barrier is a barrier assembly which includes a collapsible partition element and various coupling elements which couple the collapsible partition element to a fixed structural element to suspend the collapsible partition element in the data center hall. The coupling elements can be moved along a portion of the fixed structural element to extend the collapsible partition element through the data center hall, from a collapsed configuration into a deployed configuration, to at least partially partition a portion of the data center hall into separate areas.

In the illustrated embodiment, data center hall 600 includes an interior space 602 in which a computer room module 620 is located. Two separate deployable barriers 608A-B are deployed in the interior space 602 to collectively, with a side wall element of computer room module 620, partition a portion of the data center hall 600 into separate areas. As shown, each barrier 608 includes respective deployment mechanisms which include separate sets of coupling elements 612A-B which are coupled to both respective collapsible partition elements 610A-B and to respective fixed structural elements 630A-B. The fixed structural elements 630A-B can be coupled to respective roof structures 601A-B and can each comprise a set of one or more track structures coupled in series. The coupling elements 610 can be moved along a length of a respective fixed structural element 630 to extend the respective collapsible partition element 610 through the data center hall 600. A fixed structural element 630, including one or more track structures, can include a set of one or more channel struts, and the coupling elements 612 can include one or more channel trolleys which can roll, slide, etc. through one or more channel structures, hereinafter referred to as "channels", to extend a respective partition element 610 in a direction approximately parallel with the length of the channels 630.

In some embodiments, multiple barriers are at least partially deployed via a common fixed structural element. In the illustrated embodiment, for example, data center hall 600 includes an irregular roof structure region 604, such that a fixed structural element 640 extends along a roof structure which is disjointed from roof elements 601A-B. The fixed structural element 640 is a common fixed structural element, where coupling elements 612 of separate barriers 608A-B each move along separate portions of a length of element 640 to extend respective portions of partition elements 610A-B through a portion of the data center hall 600 that is beneath element 640.

In some embodiments, the coupling elements 612 are moved along a fixed structural element 630 via operation of a pulley system which pulls one or more coupling elements 612 along an element 630 to pull a coupled partition element 610 in a direction approximately in parallel with the length of the fixed structural element. For example, data center hall 600 includes separate pulley systems 670A-B which are each mechanically coupled to at least one coupling element 612A-B which moves along a respective fixed structural element 630A-B. A pulley system 670 can be operated to pull a mechanically coupled coupling element 612 along a respective fixed structural element 630 to extend a respective collapsible partition element 610.

In some embodiments, a barrier 608 is reversibly deployable through a portion of a data center hall 600 via reversibly coupling one or more coupling elements 612 of a given barrier 608 to a fixed structural element 630. To collapse such a barrier 608, one or more of the coupling elements 612 may be moved along a fixed structural element 630 to collapse the collapsible partition element 610 in a direction which is approximately parallel with the length of the fixed structural element 630. The coupling elements 612 can be decoupled from a fixed structural element to decouple a barrier from a fixed structural element 630. The barrier 608 can be relocated to another portion of a data center hall and redeployed via another separate fixed structural element which extends over the other portion. For example, a data center hall can include multiple sets of fixed structural elements which each extend over separate portions of the hall, and a barrier 608 can be reversibly deployed in various portions of the hall 600 via reversibly coupling the elements 612 of the barrier 608 to one of the multiple sets of elements 630. Redeployment can include collapsing a barrier 608 on one fixed structural element 630, decoupling the barrier from the element 630, coupling the barrier 608 to another fixed structural element 630, and deploying the barrier 608 on that other fixed structural element 630.

In some embodiments, a data center hall 600 includes one or more catwalk structures 642A-B which extend through the data center hall 600 at one or more elevations. The catwalk structures 642 A-B can extend proximate to one or more ends of one or more fixed structural elements 630A-B, and a barrier 608 can be deployed on a given fixed structural element 630 via an operator standing on a catwalk 642 coupling the one or more coupling elements 612 of the barrier 608 to a proximate end of a fixed structural element 630.

Each partition 610 includes coupling elements which couple the partition element to various structures, separate partition elements, etc. to at least partially enable the partition element to partition the interior space 602. In the illustrated embodiment, each partition element 610 includes side coupling elements 652 and bottom coupling elements 662. In some embodiments, elements 652 and 662 are hook and loop fasteners which couple to each other, other separate coupling elements, etc. to couple the partition elements to separate structures. For example, elements 652 of separate partition elements 610 are coupled to each other via coupling elements 654. In addition, elements 662 are coupled with computer room module 620 via coupling elements 664. In some embodiments a partition element 610 can be coupled to a side wall element, floor element, etc. of the data center hall 600.

Figure 7C:
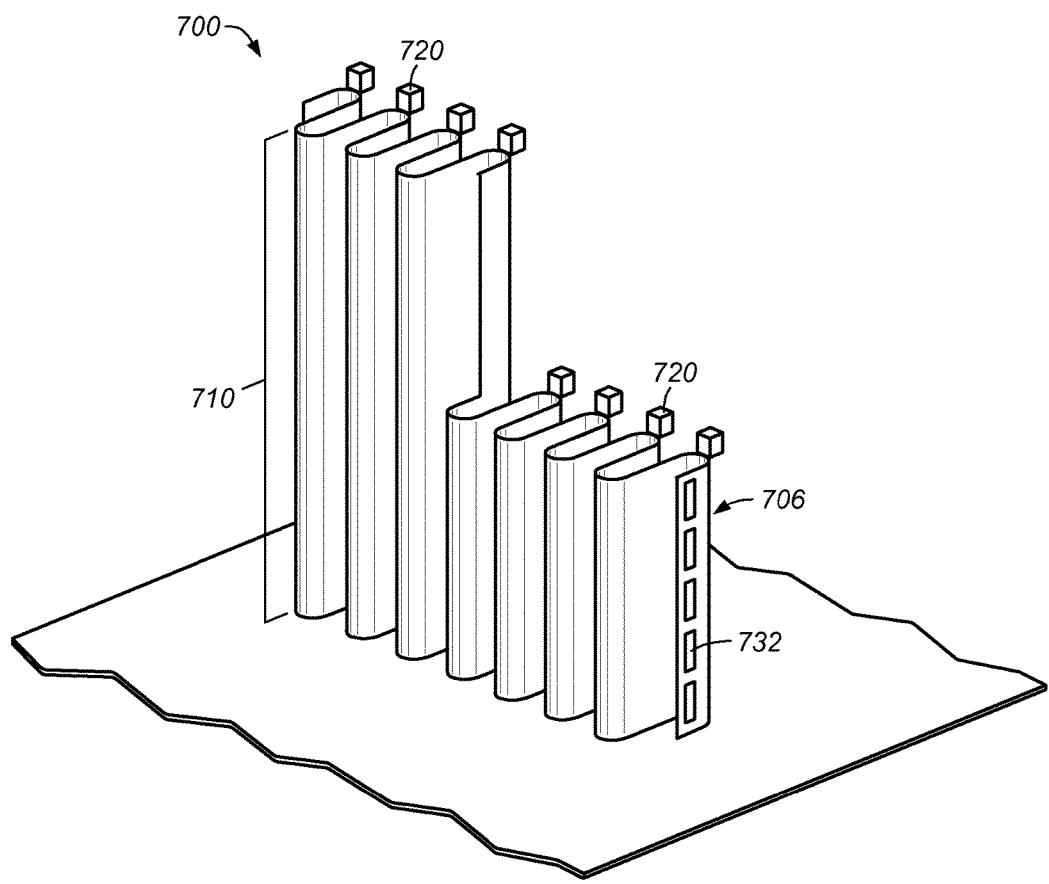

FIG. 7A-C illustrate a view of a deployable barrier, according to some embodiments.

Deployable barrier 700 includes a collapsible partition element 710 and multiple coupling elements 720 which can couple the partition element to one or more fixed structural elements and can move along the one or more fixed structural elements to reversibly extend or collapse the partition element 710 to reversibly deploy or collapse the barrier 700. In some embodiments, the partition element 710 illustrated in FIG. 7A, and various other ones of FIGS. 1-11, comprises one or more various flexible materials, including a tarpaulin material. In the illustrated embodiment, the coupling elements 720 are channel trolleys which can roll through at least a portion of a fixed structural element that includes a channel. Some coupling elements 720, including the coupling element 720 illustrated in FIG. 7B which is a channel trolley, each include a trolley body 722, one or more wheel 724, and one or more coupling points 726. The wheels 724 may be coupling points of the coupling element 720 which physically couple the coupling element with a fixed coupling structure by resting at least partially in one or more channels and rolling through the channels to move the coupling element along the fixed structural element. Coupling points 726, in some embodiments, couple with the partition element 710, so that the partition element 710 at least partially hangs from the coupling element 720 when the coupling element is at least partially coupled with a fixed coupling structure. In some embodiments, including the illustrated embodiment, at least a portion of the partition element 710 extends above the coupling elements 720, so that the partition element 710 can partition a data hall space that is above a physically coupled fixed coupling structure.

Deployable barrier 700 includes multiple coupling elements 732, 734, 736 on various side ends 706, 709 and a bottom end 708 of the partition element. In some embodiments, the coupling elements 732, 736 can couple with side elements in a data center hall to at least partially enable partition element 710 to partition the hall into separate areas. The side elements can include side wall elements of a data center hall, side wall elements of a computer room module, etc. Coupling elements 734 can couple with upper surfaces in a data center hall, where the upper surfaces can include a floor element surface, top end of a computer room module, etc.

In some embodiments, certain ends of a partition element 710 are free from coupling elements or being coupled to coupling elements. For example, in the illustrated embodiment, top ends 702, 705 are coupled to coupling elements 720, and side ends 706, 709 and bottom end 708 include coupling elements 732, 736 and 734, respectively. Side end 704 is free from including coupling elements or being coupled to coupling elements.

FIG. 7A illustrates an embodiment of deployable barrier 700 in a deployed configuration, where partition element 710 is extended to a deployed configuration, based at least in part upon coupling elements 720 being moved to extend the partition element 710 through a portion of a data center hall, so that the partition element 710 partitions the portion of the data center hall into separate areas. FIG. 7C illustrates an embodiment of deployable barrier 700 in a collapsed configuration where, coupling elements 720 are moved to collapse the partition element 710, so that the partition element 710 does not extend through a portion of a data center hall to partition the portion into separate areas.

Figure 8:
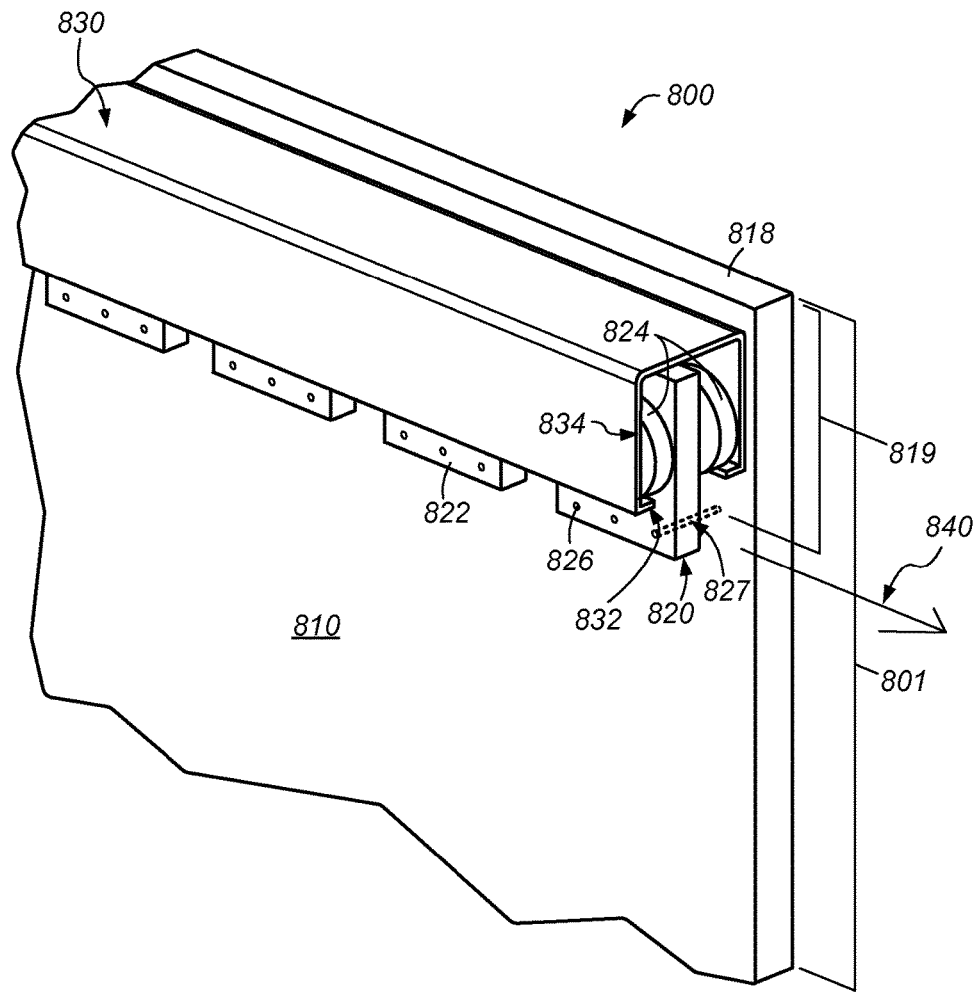
FIG. 8 illustrates a view of a deployable barrier coupled to a channel, according to some embodiments.

FIG. 8 illustrates a view of a deployable barrier coupled to a channel, according to some embodiments.

System 800 includes a deployable barrier 801 coupled to a fixed coupling structure 830. The illustrated deployable barrier 801 includes a collapsible partition element 810 and multiple channel trolley coupling elements 820 coupled to a top end of the partition element 810. Fixed coupling structure 830 includes a channel with channel base members 832 and side members 834. As shown, barrier 801 is coupled to the channel 830 via the coupling elements 820, which each rest upon the base members 832 in the channel 830 and can roll through the channel 830 to extend or collapse the partition element 810.

As shown, coupling element 820 includes a body element 822, wheel elements 824, and coupling points 826. Connectors 827, which can include a pin structure, rivet, etc., can couple the partition element to the coupling element 820 via the coupling points 826. As shown, the coupling element 820 can be coupled to the partition element at a point which is beneath the top edge 818 of the partition element 810, so that a portion 819 of the partition element 810 extends above the coupling point 826 when the partition element 810 hangs from the coupling point 816 of the coupling element 820. In some embodiment, top edge 818 extends above an upper elevation of the coupling element 820 when the partition element 810 hangs from coupling point 826.

Coupling element 820 couples with channel 830 by resting wheel elements 824 on base members 832, where the wheel elements 824 are guided by base members 832 and side members 834 so that the wheels can roll on base members 832 to move the coupling elements 820 along the channel 830 in a direction 840 approximately parallel with the direction in which the channel 830 extends.

Figure 9A:
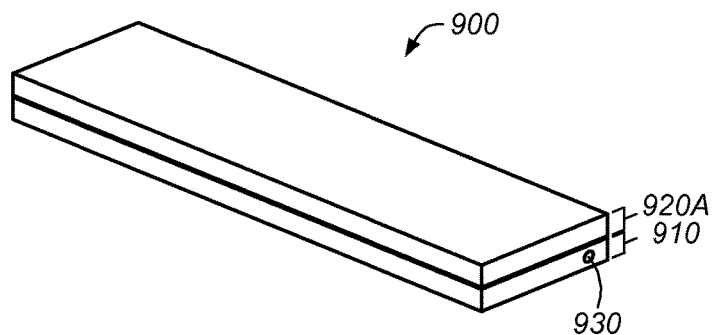
FIG. 9A-B illustrate a deployable barrier, according to some embodiments.
Figure 9B:
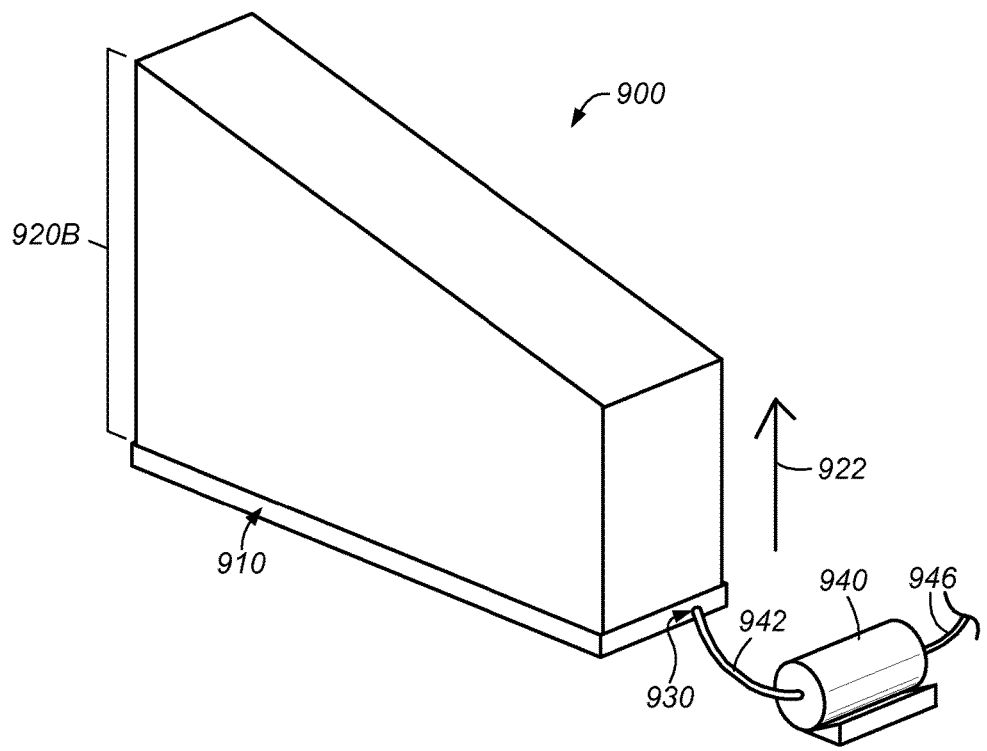

FIG. 9A-B illustrate a deployable barrier, according to some embodiments.

In some embodiments, a deployable barrier includes a partition element which itself includes an inflatable partition structure which can inflate to extend through a portion of the data center hall to partition the portion of the data center hall into separate areas. The inflatable partition structure can be inflated based at least in part upon an air supply provided to the deployable barrier from an air source.

In the illustrated embodiments, a deployable barrier 900 includes a mounting element 910, a partition element 920A-B, and a deployment mechanism 930 which includes an air conduit that supplies air to the partition element 920 to inflate the partition element 930.

FIG. 9A illustrates the deployable barrier 900 in a collapsed configuration, where partition element 920A is an inflatable partition structure which is in a collapsed configuration. As shown at FIG. 9A, an air supply can be coupled to deployment mechanism 930 to enable an air supply to inflate partition element as shown at 920B. In some embodiments, including the illustrated embodiment, deployment mechanism 930 includes an air conduit connector which can couple with an air supply and direct supplied air, via an air conduit of the deployment mechanism 930, to the inflatable partition structure 920. As shown, an air supply can include an air moving device 940, which can include one or more of a fan, blower, pump, compressor, etc. The air moving device 940 receives operating power from a power supply 946 and supplies air to the deployment mechanism 930 via an air supply conduit 942.

Air supplied via deployment mechanism 930 can inflate 922 the inflatable partition structure 920 from a collapsed configuration 920A to a deployed configuration 920B. As the inflatable partition structure 920 inflates, the partition structure can extend upwards 922 through a portion of a data center hall, so that the fully-deployed inflatable partition structure 920B partitions the portion of the data center hall into separate areas.

In some embodiments, the deployable barrier 900 can be mounted while in a collapsed configuration, as shown in FIG. 9A, via mounting the mounting element 910 to a portion of a data center hall, computer room module, etc. The mounted deployable barrier 900 can subsequently be inflated to a deployed configuration as shown in FIG. 9B, based at least in part upon coupling an air supply to the barrier 900 via deployment mechanism 930 and supplying air to inflate the inflatable partition structure to a fully-deployed configuration.

Figure 10:
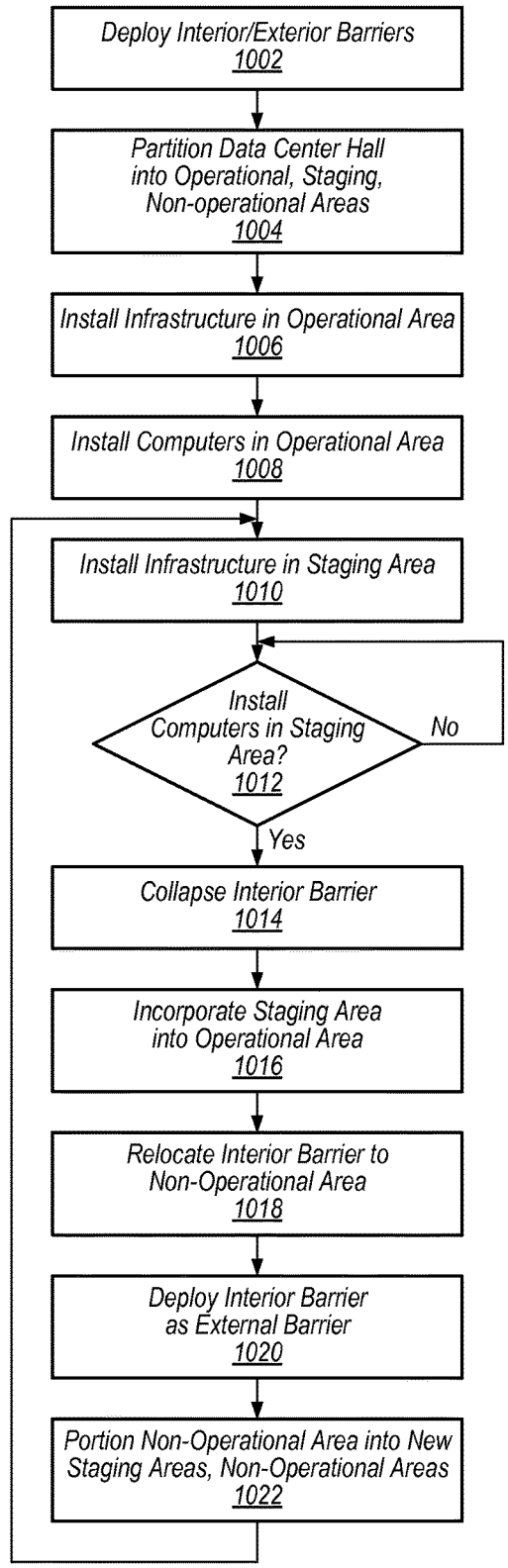
FIG. 10 illustrates reversibly deploying barriers in a data center hall to expand a partitioned operational area of the data center, according to some embodiments.

FIG. 10 illustrates reversibly deploying barriers in a data center hall to expand a partitioned operational area of the data center, according to some embodiments.

At 1002, various barriers are deployed in various portions of a data center hall. The various barriers can include a barrier referred to herein as an "internal barrier" and another barrier referred to herein as an "external barrier". The deployed barriers can partition the data center hall into separate partitioned areas. At 1004, at least some of the areas are separately established as an operational area, a staging area, and a non-operational area. The operational area and staging area may be areas which are configured to support rack computer systems on a floor element of the area, and the staging area may be located between the operational area and non-operational area. The staging area may be established as an area of the data center hall partitioned from the operational area by the internal barrier and partitioned from the non-operational area by the external area.

At 1006, one or more instances of support infrastructure are installed in at least the operational area of the data center hall. The instances of support infrastructure can include one or more support structures, one or more instances of cabling infrastructure, one or more instances of power distribution infrastructure, one or more instances of networking infrastructure, some combination thereof, or the like. Power distribution infrastructure can include one or more power distribution units (PDUs), automatic transfer switches (ATS), etc. Networking infrastructure can include one or more network switch devices, console switch devices, etc.

Instances of support infrastructure may be installed in operational area to support rack computer systems installed in predetermined rack positions. Rack positions can include predetermined portions of a floor element which are positions upon which rack computer systems are to be mounted to at least partially install the rack computer systems. The installed support infrastructure instances may be configured to support a rack computer system when the rack computer system is mounted in a rack position. For example, cabling infrastructure installed in an operational area may be configured to couple with interfaces of a rack computer system, when the rack computer system is mounted in a rack position proximate to the cabling infrastructure, to provide one or more of communicative support, power distribution support, etc. to the rack computer system.

At 1008, one or more rack computer systems are installed in one or more rack positions in the operational area. As noted above, installing a rack computer system in an operational area can include mounting the rack computer system on a predetermined rack position in the operational area and coupling the rack computer system with one or more instances of support infrastructure, via coupling various cable connections with the rack computer systems, to electrically couple the rack computer system with one or more power sources, communicatively couple the rack computer system with one or more communication networks, etc.

At 1010, one or more instances of support infrastructure are installed in the staging area. The instances of support infrastructure can include one or more support structures, one or more instances of cabling infrastructure, one or more instances of power distribution infrastructure, one or more instances of networking infrastructure, some combination thereof, or the like. In some embodiments, instances of support infrastructure installed in a staging area comprise a limited selection of support infrastructure required to support rack computer systems. For example, support structures may be installed in the staging area, while additional infrastructure, including cabling infrastructure, is not installed so long as the staging area remains separate from the operational area.

In some embodiments, at least some instances of support infrastructure are installed in the data center hall prior to deployment of barriers in the data center hall, concurrently with such deployment, etc. For example, where support infrastructure includes computer room modules which provide air plenum containment relative to one or more sets of rack positions, separate operational areas, staging areas, etc. may be determined to at least partially encompass discrete sets of computer room modules, and barriers may be deployed subsequent to assembly of at least one computer room module to establish one or more operational areas, staging areas, etc. which include the one or more computer room modules. In some embodiments, deployment of one or more barriers in a data center includes mounting a barrier on a top end of a computer room module and deploying the barrier from the computer room module towards a roof structure of the data center hall, so that the barrier and one or more side wall elements of the computer room module collectively partition a portion of the data center hall into separate areas.

At 1012, a determination is made regarding whether to install one or more rack computers in a staging area. Such a determination may be based at least in part upon a determination that present demand for computing capacity provided by the data center hall requires addition of one or more rack computer systems to the rack computer system to satisfy the demand. The determination can include a determination that no additional rack positions are available in the operational area for installation of additional rack computer systems, such that the operational area is required to be expanded to include additional rack positions.

In some embodiments, the determination is based at least in part upon a determination that the staging area is configured to support rack computer systems in the rack positions of the staging area. Such a determination can be based at least in part upon a determination that sufficient support infrastructure is installed in the staging area to support computing operations by rack computer systems, were rack computer systems installed in rack positions in the staging area.

At 1014, based at least in part upon a determination that one or more rack computer systems are to be installed in the rack positions located in the staging area, the interior barrier which partitions the operational area and staging area is at least partially collapsed to a collapsed configuration. Collapsing the barrier can include removing a partition between the operational area and staging area. At 1016, the staging area is incorporated into the operational area, such that the operational area is expanded to include the staging area and rack positions and support infrastructure included therein.

At 1018, the interior barrier, collapsed into the collapsed configuration, is relocated to a portion of the non-operational area. The portion of the non-operational area may be selected based at least in part upon proximity to the deployed external barrier. For example, a staging area between exterior and interior barriers may encompass one or more of a predetermined length, width, etc. of the data center hall, and the collapsed interior barrier may be positioned in a portion of the non-operational area which spaces the interior barrier from the exterior barrier by a distance corresponding to one or more predetermined dimensions of a staging area.

In some embodiments, the collapsed interior barrier is positioned in a portion of the non-operational area which is located between an at least partially improved portion of the non-operational area and a non-improved portion of the non-operational area. An at least partially improved portion of the non-operational area can include a portion of the non-operational area, extending from the exterior barrier away into the non-operational area, which includes a floor element which is sufficiently improved to structurally support rack computer systems on the surface of the floor element. Sufficient improvement of a floor element can include pouring, forming, and curing a concrete surface which can structurally support a rack computer system.

In some embodiments, relocating the collapsed interior barrier to the non-operational portion includes mounting the collapsed interior barrier, in a collapsed configuration, on a portion of the data center hall, one or more instances of support infrastructure, etc. For example, where a data center hall includes computer room modules, a computer room module can be installed in the non-operational area, and the collapsed interior barrier can be mounted on a top end of the computer room module.

At 1020, the interior barrier is deployed, from the collapsed state, to a deployed state to partition the non-operational area into separate areas. The deployed interior barrier may be then referred to as the "exterior barrier", and the barrier previously referred to as the exterior barrier may be referred to as the "internal barrier". At 1022, the separate areas partitioned by the deployed are established as additional separate staging areas and remainder non-operational areas. The additional staging area is established from the partitioned area of the non-operational area which is located between the deployed interior barrier and exterior barrier.

As shown in FIG. 10, upon establishment of the additional staging area, the staging area can be configured to support rack computer systems. Such configuring can include installing one or more instances of support infrastructure in the staging area, clearing the staging area to remove one or more contaminants, etc.

Figure 11A:
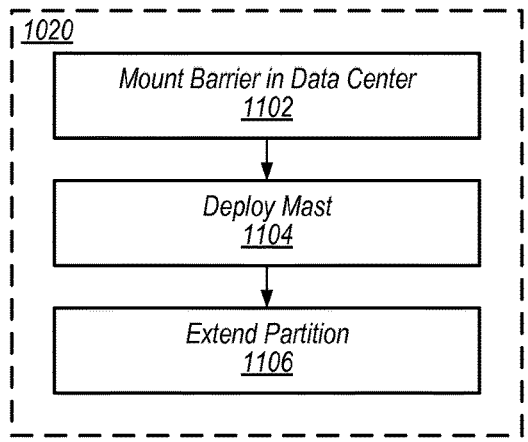
FIG. 11A-C illustrate deploying a deployable barrier in a data center hall, according to some embodiments.
Figure 11B:
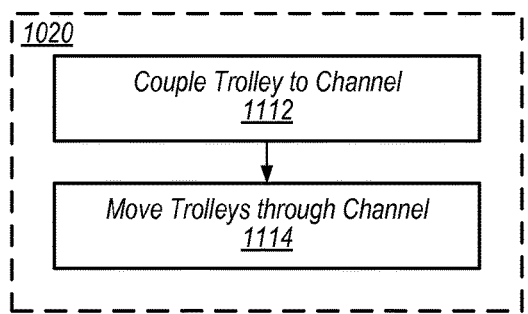
Figure 11C:
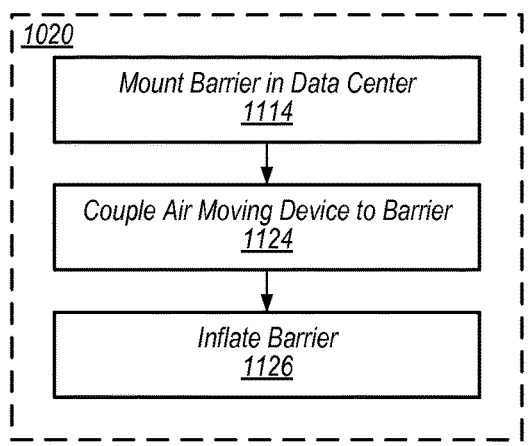

FIG. 11A-C illustrate deploying a deployable barrier in a data center hall, as illustrated above at 1020 in FIG. 10, according to some embodiments.

FIG. 11A illustrates deploying 1020 a barrier which includes a reversibly extendible mast deployment mechanism. At 1102, the barrier is mounted, in a collapsed configuration, in a portion of a data center hall. Mounting the barrier can include mounting one or more portions of a mounting element, including one or more boss structures, on a top end of a computer room module in the data center hall.

At 1104, a deployment mechanism, which can include a reversibly extendible mast structure, is deployed from the collapsed configuration into a deployed configuration. Deployment of a reversibly extendible mast can include one or more of rotating the mast to a primarily vertical orientation, securing the mast via deployment of one or more brace structures, receiving a partition boom structure into a boom support element on an extendible end of the mast, extending the mast from the mounting element and through an open space of the data center hall, extending the mast to hold the partition boom structure against the roof structure, some combination thereof, or the like. In some embodiments, a partition boom structure includes one or more cushion elements which cushion and seal an interface between the partition boom structure and a roof structure against which the partition boom structure is held when the mast is extended to a deployed configuration. In some embodiments, deploying a reversibly extendible mast includes supplying a fluid into an interior of the mast to cause the mast to extend. For example, the mast may include a telescoping pneumatic system.

At 1106, one or more collapsible partition elements are extended through the open space between the partition boom structure and the mounting element to at least partially partition the portion of the data center hall into separate areas. The partition element can be coupled to the partition boom structure, so that the partition elements can be extended downwards from the partition boom structure towards the mounting element to partition at least the open space of the portion of the data center when the partition boom structure is being held against the roof structure when the mast is extended to the deployed configuration. In some embodiments, the partition element is coupled to both the partition boom element and the mounting element and is extended upwards from the mounting element towards the roof structure of the data center hall as the partition boom structure is extended through the open space as the reversibly extendible mast is extended.

FIG. 11B illustrates deploying 1020 a barrier which includes a collapsible partition element and one or more sets of coupling elements which couple to and move along a fixed structural element to extend the partition element through a portion of a data center hall. In some embodiments, the coupling elements include one or more channel trolleys, coupled to the partition element proximate to a top end of the partition element, which can move along a fixed structural element to reversibly extend or collapse the partition element through an open space of the data center hall.

At 1112, one or more of the coupling elements of the barrier are coupled to a fixed structural element. The fixed structural element can include a channel, and the coupling elements can include one or more channel trolleys, so that coupling the coupling elements to the fixed structural element includes resting one or more wheel elements of the channel trolleys on base members of the channel, so that the channel trolleys can roll on the base members along the channel. In some embodiments, where the coupling elements are coupled to the partition element proximate to a top end of the partition element, coupling the coupling elements to the fixed structural element results in at least a portion of the partition element hanging beneath the coupling elements in an open space.

At 1114, one or more of the coupling elements which are coupled to the fixed structural element are moved along the fixed structural element to extend the collapsible partition through a portion of the data center to deploy the partition. Deploying the partition can include partitioning the portion of the data center into separate areas. In some embodiments, moving a coupling element along the fixed structural element includes moving one or more channel trolleys along a channel, via rolling action of wheel elements of the trolley against base members of a channel, to extend the partition element in a direction that is approximately parallel with the direction of the channel.

FIG. 11C illustrates deploying 1020 a barrier which includes an inflatable partition structure. At 1122, the barrier is mounted, in a collapsed configuration, in a portion of a data center hall. Mounting the barrier can include mounting one or more portions of a mounting element, including one or more boss structures, on a top end of a computer room module in the data center hall.

At 1124, one or more air moving devices are coupled to the barrier to enable an air supply to be directed into an inflatable partition structure of the barrier. In some embodiments, such coupling includes coupling an air supply conduit, extending from an output of the air moving device, to a deployment mechanism of the barrier which include an air conduit connector, so that air supplied from the air moving device is directed, via the air conduit connector, to an interior of the inflatable partition structure.

At 1126, the barrier is inflated from a collapsed configuration to a deployed configuration. Inflation can include operating the air moving device to supply air into an interior portion of the inflatable partition structure of the barrier, via the deployment mechanism. The inflatable partition structure can inflate, based at least in part upon the air supplied into the interior portion, upwards from the mounting element through a portion of the data center hall. In some embodiments, an inflatable partition structure inflates to extend upwards from the mounting element, through a portion of the data center hall towards a roof structure of the data center hall, to partition the portion of the data center hall into separate areas.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a data center hall partitioned into a plurality of areas, wherein the partitioned data center hall comprises:
     an operational area comprising a set of rack computer systems and a set of support infrastructure configured to support computing operations by the set of rack computer systems;
     a non-operational area comprising a portion of the data center hall that does not include rack computer systems and support infrastructure; and
     a staging area which is located between the operational area and non-operational area and comprising at least one additional set of support infrastructure and does not include rack computer systems; and
   a plurality of barriers configured to be reversibly deployed in the data center hall to establish the plurality of areas based at least in part upon incremental expansion of computing capacity in the data center hall, the plurality of barriers comprising:
     a first barrier which partitions the operational area from the staging area; and
     an additional barrier which partitions the staging area from the non-operational area;
   wherein each barrier of the plurality of barriers comprises at least one collapsible partition element configured to be reversibly extended to partition a portion of the data center hall into one or more of the plurality of areas,
   wherein based at least in part upon incremental expansion of computing capacity in the data center hall, the first barrier is configured to:
     collapse the at least one collapsible partition element of the first barrier;
     be redeployed into the non-operational area, based at least in part upon a determination that at least one set of rack computer systems are to be installed in the staging area, to incorporate the staging area into the operational area; and
     extend the at least one collapsible partition element of the first barrier in a portion of the non-operational area, subsequent to redeployment of the first barrier to the non-operational area, to partition the non-operational area into an additional staging area and a remainder non-operational area,
   wherein subsequent to redeployment of the first barrier, the second barrier is configured to partition an expanded operational area that includes the incorporated staging area from the additional staging area.

2. The data center of claim 1, wherein:
   wherein the staging area incorporated into the operational area comprises an additional set of rack computer systems and an additional set of support infrastructure;
   each set of support infrastructure comprises a computer room module configured to support at least one set of rack computer systems, wherein the computer room module comprises at least one side wall element and a top end; and
   to be reversibly deployed in the data center hall, each of the plurality of barriers is configured to be mounted on the top end of a separate computer room module, such that at least the collapsible partition element of a respective barrier of the plurality of barriers and at least one side wall element of a respective computer room module collectively partition a portion of the data center hall into at least two separate areas.

3. The data center of claim 2, wherein each respective barrier of the plurality of barriers comprises:
- a mounting element configured to mount the respective barrier on a respective top end of a respective one of the computer room modules; and
- a deployment mechanism configured to extend the collapsible partition element from the mounting element towards a roof structure of the data center hall to partition the portion of the data center hall into the at least two separate areas.

* * * * *